(12) United States Patent
Igarashi et al.

(10) Patent No.: US 8,463,225 B2
(45) Date of Patent: Jun. 11, 2013

(54) SEMICONDUCTOR INTEGRATED CIRCUIT AND OPERATION METHOD OF THE SAME

(75) Inventors: Yutaka Igarashi, Yokohama (JP); Yusaku Katsube, Yokohama (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/353,567

(22) Filed: Jan. 19, 2012

(65) Prior Publication Data

US 2012/0196555 A1    Aug. 2, 2012

(30) Foreign Application Priority Data

Jan. 28, 2011   (JP) ................. 2011-016387

(51) Int. Cl.
*H04B 1/28* (2006.01)

(52) U.S. Cl.
USPC ......... 455/333; 455/240.1; 455/334; 375/345

(58) Field of Classification Search
USPC ............... 455/230, 232.1, 240.1, 313, 323, 455/333, 334, 339–341; 375/345
See application file for complete search history.

(56) References Cited

U.S. PATENT DOCUMENTS

| | | | | |
|---|---|---|---|---|
| 5,023,939 A * | 6/1991 | Hori | ............. | 455/188.1 |
| 5,335,364 A * | 8/1994 | Heinonen | ............. | 455/76 |
| 6,400,935 B1 * | 6/2002 | Williams | ............. | 455/260 |
| 6,826,388 B1 | 11/2004 | Tanaka et al. | | |
| 7,215,936 B2 * | 5/2007 | Sadowski | ............. | 455/215 |
| 7,426,368 B2 * | 9/2008 | Hirai | ............. | 455/3.02 |
| 7,477,882 B2 | 1/2009 | Shimizu et al. | | |
| 7,835,467 B2 | 11/2010 | Gupta | | |
| 7,983,625 B2 * | 7/2011 | Granata | ............. | 455/78 |

FOREIGN PATENT DOCUMENTS

| | | |
|---|---|---|
| JP | 2001-211098 A | 8/2001 |
| JP | 2005-012409 A | 1/2005 |
| JP | 2007-088983 A | 4/2007 |
| JP | 2009-522936 A | 6/2009 |
| WO | WO2005/055450 A | 6/2005 |

\* cited by examiner

*Primary Examiner* — Nhan Le
(74) *Attorney, Agent, or Firm* — Mattingly & Malur, PC

(57) ABSTRACT

The present invention is provided to shorten the period of DC offset cancellation operation. One of terminals of two calibration resistors is connected to the differential output terminals of an active low pass filter having a filter process and an amplification function, and two input terminals of a voltage comparator and two terminals of a switch are connected to the other terminal of the two calibration resistors. In a calculation period of calculating digital control signals for reducing DC offset voltage, the voltage comparator detects calibration voltage depending on a voltage drop of one of the calibration resistors caused by analog current of a digital-to-analog converter. In a calibration period of reducing the DC offset voltage, the calibration analog current of the digital-to-analog converter responding to the digital control signal is passed to the input side of the filter via the switch.

20 Claims, 11 Drawing Sheets

SEMICONDUCTOR INTEGRATED CIRCUIT AND OPERATION METHOD OF THE SAME

CROSS-REFERENCE TO RELATED APPLICATIONS

The disclosure of Japanese Patent Application No. 2011-16387 filed on Jan. 28, 2011 including the specification, drawings and abstract is incorporated herein by reference in its entirety.

BACKGROUND

The present invention relates to a semiconductor integrated circuit and an operation method of the same and, more particularly, relates to a technique useful to shorten the period of a DC offset cancelling operation.

A traditional superheterodyne receiver needs an image rejection filter for removing a wave interfering an image frequency accompanying frequency conversion. Japanese Unexamined Patent Publication No. 2001-211098 (patent document 1) discloses a technique of calibrating a DC offset of a baseband amplification signal caused by an LO (local) leak or the like in a direct conversion receiver which requires no image rejection filter as an external part. Specifically, an input of a variable gain amplifier is connected to an output of a reception mixer via a low-pass filter, an input of an analog-to-digital converter is connected to an output of the variable gain amplifier, an input of a control circuit is connected to an output of the analog-to-digital converter, an input of a digital-to-analog converter is connected to an output of the control circuit, and an output of the digital-to-analog converter is connected to an offset control input terminal of the variable gain amplifier. The control circuit measures a direct current offset of an output of the variable gain amplifier, so that the direct current offset of the output of the variable gain amplifier can be calibrated by the A/D conversion and the D/A conversion.

Japanese Unexamined Patent Publication No. 2005-12409 (patent document 2) discloses a technique of preventing the influence of a change in gain setting from being exerted on a posterior stage by connecting an offset suppressor on the input side of a gain controller, monitoring an output DC level of the gain controller by a DC feedback unit, and controlling the offset suppressor so that the monitored output DC level maintains a predetermined value.

Japanese Unexamined Patent Publication No. 2007-88983 (patent document 3) discloses a reception circuit of a direct-conversion-type OFDM reception circuit having a DC offset estimation circuit for extracting a DC component by a fast Fourier transform (FFT) circuit and estimating a DC offset amount, a D/A converter for converting the estimated DC offset amount into an analog value, and a subtractor for subtracting the DC offset estimation amount as the analog value from an output of a mixer so that clipping of a baseband signal at an input of an A/D converter is suppressed and a DC component can be demodulated without losing original information of a low-frequency component.

WO 2005/055450 (patent document 4) discloses a receiving apparatus which stops operation of a high-frequency circuit such as a low noise amplifier or a quadrature demodulator only in the case where the reception field intensity of an interfering wave input from the high-frequency circuit is considerably higher than that of a desired reception signal and there is the possibility that a receiver saturates due to the interfering wave during an offset voltage calibration period, and which always sets the operation state of the high-frequency circuit such as a low noise amplifier or a quadrature demodulator without changing the operation state in the case where there is no possibility that the receiver saturates due to the interfering wave input from the high-frequency circuit before and after the offset voltage calibration period.

Japanese Unexamined Patent Application Publication (Translation of PCT Application) No. 2009-552936 (patent document 5) discloses a technique of connecting a DC offset compensation circuit including a DC offset detection circuit, a digital-to-analog program register, and a digital-to-analog converter to an output of a filter gain stage configured by an operational amplifier as a basic component of a complex filter.

RELATED ART DOCUMENTS

Patent Documents

SUMMARY

Previously to the present invention, the inventors of the present invention were engaged in research and development of a semiconductor integrated circuit having therein a direct conversion receiver which does not require an image rejection filter as an external part as described in the patent document 1.

However, receivers of the direct conversion type or low IF type do not require an image rejection filter configured as an external part such as a surface acoustic wave (SAW) filter or a dielectric filter but, on the other hand, as well known, a problem of a DC offset of a baseband amplification signal due to an LO (local) leak or the like occurs. A DC offset of the baseband amplification signal is caused by an "LO leak" which occurs when a reception local signal (LO signal) is output from an input of a low noise amplifier (LNA) and fed through an input of a reception mixer. An LO leak signal at the input terminal of the reception mixer is mixed with the reception local signal (LO signal) itself, and a DC offset as a direct current component occurs in an output of the reception mixer. The phenomenon is called "self mixing".

On the other hand, in receivers of the direct conversion type or low IF type, a channel filter removing signals out of a desired channel is disposed in a stage of processing signals in a low frequency band after frequency conversion performed by the reception mixer. The low-frequency band signal processing stage is called an analog baseband unit. The analog baseband unit has the function of a channel filter and, in addition, a signal amplifying function and a gain varying function. A filter process is realized by an active low-pass filter using parts in a semiconductor integrated circuit such as an operational amplifier, a resistor R, a capacitor C in place of external parts such as a surface acoustic wave (SAW) filter and a dielectric filter.

The gain of the amplifier having the signal amplifying function of the analog baseband unit is usually 40 dB or greater only in the analog baseband unit for a reason that a voltage gain of about 100 dB is necessary to amplify a weak wireless frequency signal having a voltage amplitude of a few μV to an amplitude of about 1V in an output of the analog baseband unit. Usually, in a direct conversion receiver, an offset input voltage of the baseband amplifier of an output of the reception mixer caused by the "LO leak" is about a few mV. However, when the signal is amplified by the gain of 40 dB, the offset output voltage in an output of the analog baseband unit becomes a few hundreds mV, so that a dynamic range of the analog baseband signal decreases.

Therefore, previously to the present invention, the inventors of the present invention investigated the DC offset cancellation circuit described in the patent document 1. However, the inventors of the present invention clarified the problem such that since the DC offset cancellation circuit described in the patent document 1 uses an analog-to-digital converter and a digital-to-analog converter, the circuit scale and the power consumption of the semiconductor integrated circuit is large. The large circuit scale of the semiconductor integrated circuit means the large semiconductor chip area of the semiconductor integrated circuit, so that there is a problem of high cost of the semiconductor integrated circuit. On the other hand, the semiconductor integrated circuit having therein the direct conversion receiver mounted in a cellular phone operates on a battery of the cellular phone. There is, consequently, a problem such that the high power consumption of the semiconductor integrated circuit shortens the life of the battery of the cellular phone.

FIG. 1 is a diagram illustrating a configuration of a DC offset cancellation circuit for cancelling DC offset voltage of a baseband amplification signal of a receiver of a direct conversion receiver provided in a semiconductor integrated circuit investigated by the inventors of the present invention previously to the present invention.

A DC offset cancellation circuit provided in the semiconductor integrated circuit investigated by the inventors of the present invention previously to the present invention shown in FIG. 1 includes a differential amplifier 302, a switch SWFIL, an active low-pass filter 301 as a channel filter, a voltage comparator CMP, an offset cancellation control circuit 100, and a digital-to-analog converter DAC0.

The direct conversion receiver provided in the semiconductor integrated circuit illustrated in FIG. 1 operates as follows in normal receiving operation of a cellular phone.

Although not illustrated in FIG. 1, a baseband signal generated from the reception mixer of the direct conversion receiver is supplied to differential input terminals IN and INB of the differential amplifier 302. A differential baseband reception amplified signal from differential output terminals OUT and OUTB of the differential amplifier 302 is supplied to a differential input terminal of the active low-pass filter 301 via the switch SWFIL. The active low-pass filter 301 functioning as a channel filter is an active low-pass filter using an operational amplifier, a resistor R, and a capacitor C, which is, for example, two Sallen-key low-pass filter circuits. As well known, a Sallen-key low-pass filter is configured by coupling or connecting an inversion input terminal and an output terminal of an operational amplifier to a connection node of two resistors in series as an input via a capacitor. The active low-pass filter 301 functioning as a channel filter removes signals other than a desired channel. The differential baseband reception amplified signal from the differential output terminals OUT2 and OUT2TB of the active low-pass filter 301 is converted to a reception digital baseband signal by the analog-to-digital converter which is not illustrated in FIG. 1, and the reception digital baseband signal is supplied to a baseband processing unit mounted on a cellular phone.

On the other hand, the direct conversion receiver provided in the semiconductor integrated circuit illustrated in FIG. 1 executes DC offset cancelling operation in an initializing sequence which is performed, for example, at the time of power-on of the cellular phone or just before start of speech.

Specifically, the level of a DC offset voltage $V_{OS1}$ between the differential output terminals OUT and OUTS of the differential amplifier 302 is detected by the voltage comparator CMP, a detection result of the voltage comparator CMP is supplied to the offset cancellation control circuit 100, and the offset cancellation control circuit 100 generates digital signals DACS, DAC2, DAC1, and DAC0 of a plurality of or set of bits in accordance with a predetermined search algorithm in response to the detection result of the voltage comparator CMP of the offset cancellation control circuit 100 and supplies them to digital input terminals of the digital-to-analog converter DAC0. Therefore, analog output currents responding to the digital signals DACS, DAC2, DAC1, and DAC0 of the plurality of or set of bits flow in the analog output terminals of the digital-to-analog converter DAC0. As a result, a voltage drop in one of two load resistors RD and RDB of the differential amplifier 302 is increased by the analog output current of the digital-to-analog converter DAC0, so that the level of the DC offset voltage $V_{OS1}$ between the differential output terminals OUT and OUTB of the differential amplifier 302 is controlled to almost zero.

The DC offset cancelling operation will be described more specifically.

First, N-channel MOS transistors MND and MNDB as a differential transistor pair of the differential amplifier 302 have the same characteristics, the same size, and the same parallel number. The load resistors RD and RDB in the differential amplifier 302 have the same resistance value. The differential amplifier 302 is configured by the MOS transistors MND and MNDB, the load resistors RD and RDB, and a DC bias current IB.

The differential amplifier 302 amplifies the signals applied to the differential signal input terminals IN and INB and outputs the amplified signals to the drains of the MOS transistors MND and MNDB. The differential transistor pair in the differential amplifier 302 is not limited to MOS transistors but bipolar transistors can be also used.

The DC offset voltage $V_{OS1}$ of the differential amplifier 302 is caused not only by the "LO leak" but also by, even in a state where no signals are supplied to the differential signal input terminals IN and INB, manufacture variations between the MOS transistors MND and MNDB and the load resistors RD and RDB, variations in resistance in signal lines, power supply lines, and ground lines, and the like.

The digital-to-analog converter DAC0 generates analog output currents corresponding to the digital DAC code input signals DACS, DAC2, DAC1, and DAC0 (hereinbelow, called DAC codes) of a plurality of or set of bits. That is, the digital-to-analog converter DAC0 is called a current steering DAC. The DAC code input signal DACS of the most significant bit (MSB) indicates the sign of the analog output current, and the DAC code input signals DAC2, DAC1, and DAC0 of the lower bits and the least significant bit (LSB) indicate the absolute values of the analog output currents.

The relations of the DAC code and the DAC code input signals DACS, DAC2, DAC1, and DAC0 of the plurality of or set of bits are as follows.

| DAC Code | DACS | DAC2 | DAC1 | DAC0 | | | | |
|---|---|---|---|---|---|---|---|---|
| 0 | 1 | 0 | 0 | 0 | 1 | 2 | 0 | 0 |
| 1 | 0 | 3 | 0 | 0 | 1 | 1 | 4 | 0 |
| 1 | 0 | 0 | 5 | 0 | 1 | 0 | 1 | 6 |
| 0 | 1 | 1 | 0 | 7 | 0 | 1 | 1 | 8 |
| 1 | 0 | 0 | 0 | 9 | 1 | 0 | 0 | 10 |
| 1 | 0 | 1 | 0 | 11 | 1 | 0 | 1 | 12 |
| 1 | 1 | 0 | 0 | 13 | 1 | 1 | 0 | 14 |
| 1 | 1 | 1 | 0 | 15 | 1 | 1 | 1 | 1 |

In the digital-to-analog converter DAC0, DC reference voltage $V_{BG}$ is converted to current by an operational amplifier circuit OPA0, a P-channel MOS transistor MP0, and a resistor R0. When power supply voltage is $V_{DD}$, DC reference current $I_{REF}$ given by the following equation flows from the drain of the P-channel MOS transistor MP0 to the drain of an N-channel MOS transistor MN0.

$$I_{REF} = \frac{V_{DD} - V_{BG}}{R_0} \quad \text{Equation (1)}$$

N-channel MOS transistors MN0, MN1, MN2, and MN3 have the same characteristics, and the integer expressed by the sign "m" in FIG. 1 indicates the number of N channel MOS transistors coupled or connected in parallel.

For example, only one transistor MN1 of m=1 exists, and the transistors MN3 of m=4 having the same size as that of four transistors MN1 are coupled or connected in parallel. In such arrangement, by turning on a switch SW0 by the DAC code input signal DAC0 of the least significant bit (LSB) of the high level H, the current $I_{REF}$ flows in the drain of the N-channel MOS transistor MN1. By turning on a switch SW1 by the DAC code input signal DAC1 of the second bit of the high level H, current $2 \times I_{REF}$ flows in the drain of the N-channel MOS transistor MN2. By turning on a switch SW2 by the DAC code input signal DAC2 of the third bit of the high level H, current $4 \times I_{REF}$ flows in the drain of the N-channel MOS transistor MN3. When the switches SW0, SW1, and SW2 are turned off, the drain currents in the N-channel MOS transistors MN0, MN1, and MN2 become zero. Therefore, since the switches SW0, SW1, SW2, and SWS perform the on/off operation in accordance with a switch polarity diagram 200 in FIG. 1 in response to the high level H=1 and the low level L=0 of the DAC code to the DAC code input signals DAC2, DAC1, and DAC0, analog output current $I_{DACout}$ of the digital-to-analog converter DAC0 becomes as follows.

That is, when DACS=0, $I_{DACout}$ (terminal 1 in SWS)=0 and $I_{DACout}$ (terminal 2 in SWS) $(4 \times DAC2 + 2 \times DAC1 + DAC0) \times I_{REF}$. When DACS=1, $I_{DACout}$ (terminal 1 in SWS)=$(4 \times DAC2 + 2 \times DAC1 + DAC0) \times I_{REF}$ and $I_{DACout}$ (terminal 2 in SWS)=0.

When the current passed to the terminal 2 side in the polarity switch SWS is positive, the analog output current $I_{DACout}$ of the digital-to-analog converter DAC0 becomes as follows.

$I_{DACout} = I_{DACout}$ (terminal 2 in SWS)$-I_{DACout}$ (terminal 1 in SWS)

FIG. 3 is a diagram showing the relation between the analog output current $I_{DACout}$ of the digital-to-analog converter DAC0 in the DC offset cancellation circuit provided in the semiconductor integrated circuit investigated by the inventors of the present invention previously to the present invention illustrated in FIG. 1 and the DAC code.

As illustrated in FIG. 3, the analog output current $I_{DACout}$ increases from 0 to $7 \times I_{REF}$ with respect to the DAC codes from 0 to 7 and, on the other hand, decreases from 0 to $-7 \times I_{REF}$ with respect to the DAC codes from 8 to 15.

FIG. 2 is a diagram for explaining DC offset cancelling operation of the DC offset cancellation circuit provided in the semiconductor integrated circuit investigated by the inventors of the present invention previously to the invention shown in FIG. 1.

As illustrated in the timing chart of FIG. 2, a clock signal CLK is supplied to the clock signal input terminal of the offset cancellation control circuit 100. On start of the DC offset cancelling operation, an offset compensation start signal CAL of the high level H "1" is supplied to the offset cancellation control circuit 100 and the switch SWFIL. Therefore, in the switch SWFIL, the terminal 1 and the terminal 3 enter the on state, and the terminal 2 and the terminal 1 enter the off state, so that the differential input terminals of the active low-pass filter 301 are disconnected from the differential output terminals OUT and OUTB of the differential amplifier 302 and coupled or connected to a predetermined DC bias current Vbias. In the timing chart of FIG. 2, P1 to P6 shown above the clock signals CLK indicate the numbers of the clock signals CLK. The level of the predetermined DC bias current voltage Vbias is set to a value close to the drain bias voltage of the MOS transistors MND and MNDB of the differential amplifier 302.

At the negative edge of the first clock signal CLK P1, the offset compensation start signal CAL of the high level H "1" is supplied to start the DC offset cancelling operation by the DC offset cancellation circuit illustrated in FIG. 1. Therefore, since the differential input terminals of the active low-pass filter 301 are disconnected from the differential output terminals OUT and OUTB of the differential amplifier 302 and coupled or connected to the predetermined DC bias voltage Vbias, even when the analog output current $I_{DACout}$ of the digital-to-analog converter DAC0 changes, the capacitance of the active low-pass filter 301 is not discharged. Therefore, even when the digital signals DACS, DAC2, DAC1, and DAC0 of the plurality of or set of bits are supplied as the DAC code input signals of the digital-to-analog converter DAC0 at high speed, the voltage comparator CMP0 can accurately determine the polarity (positive or negative polarity) and the absolute value voltage level of the DC offset voltage $V_{OS1}$ between the differential output terminals OUT and OUTB of the differential amplifier 302.

When the offset compensation start signal CAL of the high level H "1" is supplied at the negative edge of the first clock signal CLK P1, the digital signals DACS, DAC2, DAC1, and DAC0 of the plurality of or set of bits are still in the low level L "0".

In the timing chart of FIG. 2, the first DC offset voltage $V_{OS1}$ of the differential output terminals of the differential amplifier 302 is, as an example, positive DC offset voltage. However, it may be negative DC offset voltage.

In the case where the first DC offset voltage $V_{OS1}$ is positive DC offset voltage, the output CMP of the voltage comparator CMP0 becomes the high level H "1". In the case where the first DC offset voltage $V_{OS1}$ is negative DC offset voltage, the output CMP of the voltage comparator CMP0 becomes the low level L "0".

At the negative edge of the second clock signal CLK P2, the offset cancellation control circuit 100 stores a derived result of the DC offset voltage $V_{OS1}$ by the voltage comparator CMP0. Therefore, in the case of positive DC offset voltage, the offset cancellation control circuit 100 controls the terminal 3 and the terminal 1 of the polarity switch SWS to the on state and controls the terminal 3 and the terminal 2 to the off state. In the case of negative DC offset voltage, the offset cancellation control circuit 100 controls the terminal 3 and the terminal 1 of the polarity switch SWS to the off state and controls the terminal 3 and the terminal 2 to the on state.

As a result, in the case where the DC offset voltage $V_{OS1}$ is positive DC offset voltage, the analog output current $I_{DACout}$ flows from the differential output terminal OUT of the differential amplifier 302 to the digital-to-analog converter DAC0, and the DC offset voltage $V_{OS1}$ shifts to the negative side. In the case where the DC offset voltage $V_{OS1}$ is negative DC offset voltage, the analog output current $I_{DACout}$ flows from the differential output terminal OUTB of the differential amplifier 302 to the digital-to-analog converter DAC0, and the DC offset voltage $V_{OS1}$ shifts relatively to the positive side. As described above, the offset cancellation control circuit 100 executes switching in the polarity switch SWS so that the analog output current $I_{DACout}$ of the digital-to-analog converter DAC0 flows from the output terminal having higher output terminal voltage between the differential output terminals OUT and OUTB of the differential amplifier 302. For the DAC code input signal DACS of the most significant bit (MSB) after that, the value DACS (P2) of the DAC code input signal DACS of the most significant bit (MSB) stored in the offset cancellation control circuit 100 at the timing of the negative edge of the second clock signal CLK P2 is used.

Next, at the positive edge of the third clock signal CLK P3, the offset cancellation control circuit 100 supplies the DAC code input signals DAC2, DAC1, and DAC0 having the relation shown below to the digital-to-analog converter DAC0.

DACS=DACS (P2)
DAC2=high level H "1"
DAC1=low level L "0"
DAC0=low level L "0"

In response to the DAC code input signals DAC2, DAC1, and DAC0 having the relation, the first analog output current $I_{DACout}$ depending on the DAC code shown in FIG. 3 flows from the output terminal having higher output terminal voltage out of the differential output terminals OUT and OUTB of the differential amplifier 302 to the output of the digital-to-analog converter DAC0. As a result, the DC offset voltage $V_{OS1}$ between the differential output terminals OUT and OUTB of the differential amplifier 302 changes from the value of the first DC offset voltage to the second DC offset voltage $V_{OS1}$ in response to the first analog output current $I_{DACout}$.

In the case where the second DC offset voltage $V_{OS1}$ responding to the positive edge of the third clock signal CLK P3 is positive DC offset voltage, the output CMP of the voltage comparator CMP0 becomes the high level H "1". In the case where the second DC offset voltage $V_{OS1}$ is negative DC offset voltage, the output CMP of the voltage comparator CMP0 becomes the low level L "0".

At the negative edge of the third clock signal CLK P3, the offset cancellation control circuit 100 stores a derived result of the second DC offset voltage $V_{OS1}$ by the voltage comparator CMP0. Therefore, in the case where the second DC offset voltage $V_{OS1}$ is positive DC offset voltage, the offset cancellation control circuit 100 controls the terminal 3 and the terminal 1 of the switch SW2 to the on state and controls the terminal 3 and the terminal 2 to the off state by the DAC code input signal DAC2 of the second highest bit of the high level H "1". On the other hand, in the case where the second DC offset voltage $V_{OS1}$ is negative DC offset voltage, the offset cancellation control circuit 100 controls the terminal 3 and the terminal 1 of the switch SW2 to the off state and controls the terminal 3 and the terminal 2 to the on state by the DAC code input signal DAC2 of the second highest bit of the low level L "0". For the DAC code input signal DAC2 of the second highest bit after that, the value DAC2 (P3) of the DAC code input signal DAC2 of the second highest bit stored in the offset cancellation control circuit 100 at the timing of the negative edge of the third clock signal CLK P3 is used.

Next, at the positive edge of the fourth clock signal CLK P4, the offset cancellation control circuit 100 supplies the DAC code input signals DAC2, DAC1, and DAC0 having the relation shown below to the digital-to-analog converter DAC0.

DACS=DACS (P2)
DAC2=DAC2 (P3)
DAC1=high level H "1"
DAC0=low level L "0"

In response to the DAC code input signals DAC2, DAC1, and DAC0 having the relation, the second analog output current $I_{DACout}$ depending on the DAC code shown in FIG. 3 flows from the output terminal having higher output terminal voltage out of the differential output terminals OUT and OUTB of the differential amplifier 302 to the output terminal of the digital-to-analog converter DAC0. As a result, the DC offset voltage $V_{OS1}$ between the differential output terminals OUT and OUTB of the differential amplifier 302 changes from the value of the second DC offset voltage to the third DC offset voltage $V_{OS1}$ in response to the second analog output current $I_{DACout}$.

In the case where the third DC offset voltage $V_{on}$ responding to the positive edge of the fourth clock signal CLK P4 is positive DC offset voltage, the output CMP of the voltage comparator CMP0 becomes the high level H "1". In the case where the third DC offset voltage $V_{OS1}$ is negative DC offset voltage, the output CMP of the voltage comparator CMP0 becomes the low level L "0".

At the negative edge of the fourth clock signal CLK P4, the offset cancellation control circuit 100 stores a derived result of the third DC offset voltage $V_{OS1}$ by the voltage comparator CMP0. Therefore, in the case where the third DC offset voltage $V_{OS1}$ is positive DC offset voltage, the offset cancellation control circuit 100 controls the terminal 3 and the terminal 1 of the switch SW1 to the on state and controls the terminal 3 and the terminal 2 to the off state by the DAC code input signal DAC1 of the third highest bit of the high level H "1". On the other hand, in the case where the third DC offset voltage $V_{OS1}$ is negative DC offset voltage, the offset cancellation control circuit 100 controls the terminal 3 and the terminal 1 of the switch SW2 to the off state and controls the terminal 3 and the terminal 2 to the on state by the DAC code input signal DAC1 of the third highest bit of the low level L "0". For the DAC code input signal DAC1 of the third highest bit after that, the value DAC1 (P4) of the DAC code input signal DAC1 of the third highest bit stored in the offset cancellation control circuit 100 at the timing of the negative edge of the fourth clock signal CLK P4 is used.

Next, at the positive edge of the fifth clock signal CLK P5, the offset cancellation control circuit 100 supplies the DAC code input signals DAC2, DAC1, and DAC0 having the relation shown below to the digital-to-analog converter DAC0.

DACS=DACS (P2)
DAC2=DAC2 (P3)
DAC1=DAC1 (P4)
DAC0=high level H "1"

In response to the DAC code input signals DAC2, DAC1, and DAC0 having the relation, the third analog output current $I_{DACout}$ depending on the DAC code shown in FIG. 3 flows from the output terminal having higher output terminal voltage out of the differential output terminals OUT and OUTS of the differential amplifier 302 to the output terminal of the digital-to-analog converter DAC0. As a result, the DC offset voltage $V_{OS1}$ between the differential output terminals OUT and OUTB of the differential amplifier 302 changes from the value of the third DC offset voltage to the fourth DC offset voltage $V_{OS1}$ in response to the third analog output current $I_{DACout}$.

In the case where the fourth DC offset voltage $V_{OS1}$ responding to the positive edge of the fifth clock signal CLK P5 is positive DC offset voltage, the output CMP of the voltage comparator CMP0 becomes the high level H "1". In the case where the fourth DC offset voltage $V_{OS1}$ is negative DC offset voltage, the output CMP of the voltage comparator CMP0 becomes the low level L "0".

At the negative edge of the fifth clock signal CLK P5, the offset cancellation control circuit 100 stores a derived result of the fourth DC offset voltage $V_{OS1}$ by the voltage comparator CMP0. Therefore, in the case where the fourth DC offset voltage $V_{OS1}$ is positive DC offset voltage, the offset cancellation control circuit 100 controls the terminal 3 and the terminal 1 of the switch SW0 to the on state and controls the terminal 3 and the terminal 2 to the off state by the DAC code input signal DAC0 of the least significant bit (LSB) of the high level H "1". On the other hand, in the case where the fourth DC offset voltage $V_{OS1}$ is negative DC offset voltage, the offset cancellation control circuit 100 controls the terminal 3 and the terminal 1 of the switch SW2 to the off state and controls the terminal 3 and the terminal 2 to the on state by the DAC code input signal DAC0 of the least significant bit (LSB) of the low level L "0". For the DAC code input signal DAC0 of the least significant bit (LSB) after that, the value DAC0 (P5) of the DAC code input signal DAC0 of the least significant bit (LSB) stored in the offset cancellation control circuit 100 at the timing of the negative edge of the fifth clock signal CLK P5 is used.

At this time point, the DC offset voltage $V_{OS1}$ between the differential output terminals OUT and OUTB of the differential amplifier 302 is converged to a small voltage value of $\pm 0.5 \times I_{REF} \times RD$ by the DC offset cancelling operation of the DC offset cancellation circuit.

Finally, to finish the DC offset cancelling operation of the DC offset cancellation circuit, the offset compensation start signal CAL supplied to the offset cancellation control circuit 100 and the switch SWFIL is changed from the high level H "1" to the low level L "0" at the negative edge timing of the sixth clock signal CLK P6.

Therefore, in the switch SWFIL, the terminal 3 and the terminal 1 are controlled to the off state and the terminal 3 and the terminal 2 are set to the on state, thereby finishing the DC offset cancelling operation of the DC offset cancellation circuit.

There is the possibility that the DC offset cancelling operation of the DC offset cancellation circuit provided in the semiconductor integrated circuit investigated by the inventors of the present invention previously to the present invention illustrated in FIG. 1 delays when the analog output current $I_{DACout}$ of the digital-to-analog converter DAC0 changes largely in the timing chart of FIG. 2. In the timing chart of FIG. 2, at each of the clock timings of the third clock signal CLK P3, the fourth clock signal CLK P4, and the fifth clock signal CLK P5, the analog output current $I_{DACout}$ of the digital-to-analog converter DAC0 changes largely. If the capacitor of the active low-pass filter 301 is charged/discharged with the analog output current $I_{DACout}$ of the digital-to-analog converter DAC0, the polarity (positive or negative polarity) of the DC offset voltage $V_{OS1}$ and the absolute voltage level in the differential amplifier 302 cannot be determined accurately by the detection result of the voltage comparator CMP for cancelling the offset until the time point of completion of the charging/discharging.

On the other hand, the switch SWFIL is used in the DC offset cancellation circuit provided in the semiconductor integrated circuit investigated by the inventors of the present invention previously to the present invention illustrated in FIG. 1. During the period of the DC offset cancelling operation, the output terminal of the differential amplifier 302, the input terminal of the voltage comparator CMP, and the analog output terminal of the digital-to-analog converter DAC0 are disconnected from the input terminals of the active low-pass filter 301 by the switch SWFIL. Therefore, even when the analog output current $I_{DACout}$ of the digital-to-analog converter DAC0 changes, the capacitor of the active low-pass filter 301 is not charged/discharged. Consequently, even the digital signals DACS, DAC2, DAC1, and DAC0 of the plurality of or set of bits are supplied at high speed as the DAC code input signals of the digital-to-analog converter DAC0, the voltage comparator CMP0 can accurately determine the polarity (positive or negative polarity) and the absolute voltage level of the DC offset voltage $V_{OS1}$ between the differential output terminals OUT and OUTB of the differential amplifier 302.

After all of the values of the digital signals DACS, DAC2, DAC1, and DAC0 of the plurality of or set of bits are determined from the derived result of the voltage comparator CMP0 by the DC offset cancelling operation, the switch SWFIL is switched, and the output terminal of the differential amplifier 302 and the input terminal of the active low-pass filter 301 are coupled or connected to each other via the switch SWFIL. At the time of coupling, the operation of charging/discharging the capacitor of the active low-pass filter 301 is performed and time is required until the DC offset voltage $V_{OS1}$ of the differential amplifier 302 is stabilized according to transient response characteristics of the active low-pass filter 301. However, the DC offset voltage $V_{OS1}$ of the differential amplifier 302 is originally small as tens mV and the DC bias voltage Vbias is set to a voltage value close to the drain bias voltage of the MOS transistors MND and MNDB of the differential amplifier 302, so that the settling time of the DC offset voltage $V_{OS1}$ can be short and ignored.

On the other hand, as the active low-pass filter of the analog baseband unit of the direct conversion receiver, usually, a fifth-order to eighth-order Butterworth low-pass filter or a Chebyshev low-pass filter is used. Since the analog baseband unit in the direct conversion receiver needs a channel filter of two channels, an I channel of an in-phase component, and a Q channel of a quadrature component, about eight to 16 operational amplifiers are necessary for the eighth-order Butterworth low-pass filter.

When the current consumption of one operational amplifier is 1 mA, large current of about 8 to 16 mA is consumed only by the eighth-order Butterworth filter, and power consumption is large.

With miniaturization in the semiconductor manufacturing process of the semiconductor integrated circuit, the power supply voltage $V_{DD}$ also decreases. There is consequently tendency that the load resistors RD and RDB of the differential amplifier 302 in the DC offset cancellation circuit provided in the semiconductor integrated circuit investigated by the inventors of the present invention previously to the present invention illustrated in FIG. 1 are not used. The reason is that the dynamic range becomes smaller due to a voltage drop of RD×IB2 from the power supply voltage $V_{DD}$ to the drain of the N-channel MOS transistors MND and MNDB. Consequently, there is tendency of employing an operational amplifier which can realize the stabilized gain by using the differential amplifier having the active load in which the voltage drop is smaller, not the differential amplifier having a resistance load in which the voltage drop is large. Therefore, previously to the present invention, the inventors of the present invention investigated the technique of realizing the channel filter in the analog baseband unit in the direct conversion receiver by an active RC low-pass filter having the biquad configuration including the operational amplifier having the two functions of the filter process and the amplification function (voltage gain).

FIG. 4 is a diagram showing the configuration of another DC offset cancellation circuit for cancelling DC offset voltage of a baseband amplification signal of a direct conversion receiver provided in the semiconductor integrated circuit investigated by the inventors of the present invention previously to the present invention.

The another DC offset cancellation circuit investigated by the inventors of the present invention previously to the present invention illustrated in FIG. 4 is different from the DC offset cancellation circuit investigated by the inventors of the present invention previously to the present invention illustrated in FIG. 1 with respect to the point that the differential amplifier 302 and the active low-pass filter 301 as the channel filter in FIG. 1 are replaced with an active RC low-pass filter 300 of the biquad configuration having the voltage amplifying function as the channel filter in FIG. 4.

In the active RC low-pass filter 300 having the biquad configuration of the DC offset cancellation circuit illustrated in FIG. 4, the first stage is configured by a perfect integrator, and the second stage is configured by an imperfect integrator in which a feedback capacitor C11 is discharged by a variable feedback capacitor R3.

That is, in the channel filter shown in FIG. 4, the non-inversion input terminal INT and the inversion input terminal INB are coupled or connected to the non-inversion input terminal − and the non-inversion input terminal + of the operational amplifier OPA1 in the first stage via resistors R1 and R1, respectively. The feedback capacitor C1 is coupled or connected between the inversion input terminal − and the non-inversion output terminal + of the operational amplifier OPA1 in the first stage, and the feedback capacitor C1 is coupled or connected between the non-inversion input terminal + and the inversion output terminal − of the operational amplifier OPA1 in the first stage. The non-inversion output terminal + and the inversion output terminal − of the operational amplifier OPA1 in the first stage are coupled or connected to the inversion input terminal − and the non-inversion input terminal + of the operational amplifier OPA2 in the second stage via the resistors R2 and R2, respectively. The feedback capacitor C1 and the variable feedback resistor R3 are coupled or connected in parallel between the inversion input terminal − and the non-inversion output terminal + of the operational amplifier OPA2 in the second stage, and the feedback capacitor C1 and the variable feedback resistor R3 are coupled or connected in parallel between the non-inversion input terminal + and the inversion output terminal − of the operational amplifier OPA2 in the second stage. The feedback resistor R2 is coupled or connected between the inversion output terminal − of the operational amplifier OPA2 in the second stage and the inversion input terminal − of the operational amplifier OPA1 in the first stage, and the feedback resistor R2 is coupled or connected between the non-inversion output terminal + of the operational amplifier OPA2 in the second stage and the non-inversion input terminal + of the operational amplifier OPA1 in the first stage. The non-inversion output terminal + and the inversion output terminal − of the operational amplifier OPA2 in the second stage are set as the non-inversion output terminal OUTT and the inversion output terminal OUTB.

A transfer function $H(s) = V_{OUT}/V_{IN}$ indicative of the relation between the input signal voltage $V_{IN}$ supplied across the non-inversion input terminal INT and the inversion input terminal INB of the active RC low-pass filter 300 having the biquad configuration of the DC offset cancellation circuit illustrated in FIG. 4 and the output signal voltage $V_{OUT}$ generated between the non-inversion output terminal OUTT and the inversion output terminal OUTB is given by the following equation (2).

$$H(s) = \frac{V_{OUT}}{V_{IN}} \quad \text{Equation (2)}$$

$$= K \cdot \frac{\frac{1}{C_1^2 \cdot R_2^2}}{S^2 + \frac{1}{C_1 \cdot R_3} \cdot S + \frac{1}{C_1^2 \cdot R_2^2}}$$

$$= K \cdot \frac{\omega_0^2}{S^2 + \frac{\omega_0}{Q} \cdot S + \omega_0^2}$$

where $s = j \cdot 2\pi f$, and $\omega_0$, Q, and K are given by the following equations.

$$\omega_0 = \frac{1}{C_1 \cdot R_2} \quad \text{Equation (3)}$$

$$Q = \frac{R_3}{R_2} \quad \text{Equation (4)}$$

$$K = \frac{R_2}{R_1} \quad \text{Equation (5)}$$

Therefore, in the active RC low-pass filter 300 having the biquad configuration of the DC offset cancellation circuit illustrated in FIG. 4, when the frequency f of the reception baseband signal is equal to zero, the transfer function $H(s) = V_{OUT}/V_{IN} = K$. Consequently, the filter becomes a low-pass filter with the voltage gain of K times. Therefore, by selecting the performance index Q and the natural frequency $\omega_0$ to obtain desired low-pass filter characteristics, a performance index Q, further, determining the resistance values of the resistors R1, R2, and R3 and the capacitance value of the capacitor C1, and simultaneously determining the resistance values of the resistors R1 and R2 so as to obtain a desired voltage gain K, the filter process and the amplification function can be realized at the same time.

The DC offset voltage $V_{OS1}$ of the active RC low-pass filter 300 having the biquad configuration in the DC offset cancellation circuit illustrated in FIG. 4 is caused not only by the "LO leak" but also by, even in a state where no signals are supplied to the differential signal input terminals IN and INB, manufacture variations between the operational amplifiers OPA1 and OPA2 and the resistors R1, R2, and R3, variations in resistance in signal lines, power supply lines, and ground lines, and the like.

Therefore, the another DC offset cancellation circuit for cancelling the DC offset voltage of the baseband amplification signal of the direct conversion receiver provided in the semiconductor integrated circuit investigated by the inventors of the present invention previously to the present invention shown in FIG. 4 also includes, like the DC offset cancellation circuit shown in FIG. 1, the voltage comparator CMP, the offset cancellation control circuit 100, and the digital-to-analog converter DAC0.

That is, the direct conversion receiver provided in the semiconductor integrated circuit illustrated in FIG. 4 executes DC offset cancelling operation to be described later in an initial sequence at the time of power on of a cellular phone, just before start of speech, or the like.

That is, the level of the DC offset voltage $V_{OS1}$ of the differential output terminals OUTT and OUTB of the active RC low-pass filter 300 having the biquad configuration is detected by the voltage comparator CMP, and a detection result of the voltage comparator CMP is supplied to the offset cancellation control circuit 100. The offset cancellation control circuit 100 generates digital signals DACS, DAC2, DAC1, and DAC0 of a plurality of or set of bits in accordance with a predetermined search algorithm in response to the detection result of the voltage comparator CMP and supplies the signals to digital input terminals of the digital-to-analog converter DAC0. As a result, analog output currents responding to the digital signals DACS, DAC2, DAC1, and DAC0 of a plurality of or set of bits flow in the analog output terminals of the digital-to-analog converter DAC0. Therefore, a voltage drop in one of the two negative feedback resistors R2 and R2 of the active RC low-pass filter 300 having the biquad configuration is increased by the analog output current of the digital-to-analog converter DAC0, so that the level of the DC offset voltage $V_{OS1}$ of the differential output terminals OUTT and OUTB of the filter 300 is controlled to almost zero.

FIG. 5 is a diagram for explaining DC offset cancelling operation of another DC offset cancellation circuit investigated by the inventors of the present invention previously to the present invention illustrated in FIG. 4.

Also in the diagram for explaining the DC offset cancelling operation shown in FIG. 5, like in the diagram for explaining the DC offset cancelling operation shown in FIG. 2, the offset cancellation control circuit 100 determines the digital DAC code input signals DACS, DAC2, DAC1, and DAC0 (DAC codes) of a plurality of or set of bits supplied to the digital input terminals of the digital-to-analog converter DAC0 in response to the derived result of the DC offset voltage $V_{OS1}$ by the voltage comparator CMP0. Therefore, the analog output current corresponding to the level of the DC offset voltage $V_{OS1}$ between the differential output terminals OUTT and OUTB of the active RC low-pass filter 300 having the biquad configuration of FIG. 4 flows in the analog output terminal of the digital-to-analog converter DAC0. As a result, the voltage drop in one of the two negative feedback resistors R2 and R2 of the active RC low-pass filter 300 having the biquad configuration is increased by the analog output current of the digital-to-analog converter DAC0, so that the voltage level of the DC offset voltage $V_{OS1}$ of the differential output terminals OUTT and OUTB of the filter 300 is controlled to almost zero. That is, the offset cancellation control circuit 100 stores a derived result of the DC offset voltage $V_{OS1}$ by the voltage comparator CMP0. In the case of positive DC offset voltage, the offset cancellation control circuit 100 controls the terminal 3 and the terminal 1 of the polarity switch SWS to the on state and controls the terminal 3 and the terminal 2 to the off state. In the case of negative DC offset voltage, the offset cancellation control circuit 100 controls the terminal 3 and the terminal 1 of the polarity switch SWS to the off state and controls the terminal 3 and the terminal 2 to the on state. In the case where the DC offset voltage $V_{OS1}$ is positive DC offset voltage, the analog output current $I_{DACout}$ flows from the differential output terminal OUTB of the active RC low-pass filter 300 to the digital-to-analog converter DAC0 via the resistor R2 on the upper side, and the DC offset voltage $V_{OS1}$ shifts to the negative side. In the case where the DC offset voltage $V_{OS1}$ is negative DC offset voltage, the analog output current $I_{DACout}$ flows from the differential output terminal OUT of the active RC low-pass filter 300 to the digital-to-analog converter DAC0 via the resistor 2 on the lower side, and the DC offset voltage $V_{OS1}$ shifts relatively to the positive side.

However, since the active RC low-pass filter 300 having the biquad configuration of the DC offset cancellation circuit illustrated in FIG. 4 includes four capacitors C1 to realize two functions of the filter process and the amplifying function (voltage gain), as understood from the diagram for explaining the DC offset cancelling operation shown in FIG. 5, considerably long settling time is necessary to change the DC offset voltage $V_{OS1}$ in response to a change in the digital DAC code input signals DACS, DAC2, DAC1, and DAC0 of the plurality of or set of bits supplied to the digital-to-analog converter DAC0 to a stable voltage value. In the lapse period of the settling time, the voltage comparator CMP0 cannot accurately determine the polarity (positive or negative polarity) and the absolute value voltage level of the DC offset voltage $V_{OS1}$ between the differential output terminals OUTT and OUTB of the active RC low-pass filter 300. Therefore, the problem such that the cancel-off operation period since start of the DC offset cancelling operation of the DC offset cancellation circuit to the end is long was made clear by the investigation conducted by the inventors of the present invention previously to the present invention.

FIG. 6 is a diagram showing a state where a DC offset voltage of a baseband amplification signal of the direct conversion receiver provided in the semiconductor integrated circuit is cancelled by another DC offset cancellation circuit investigated by the inventors of the present invention previously to the present invention illustrated in FIG. 4.

As illustrated in FIG. 6, a semiconductor integrated circuit IC has therein the active RC low-pass filter 300 having the biquad configuration, the voltage comparator CMP, the offset cancellation control circuit 100, and the digital-to-analog converter DAC0 and, in addition, a low noise amplifier LNA, a reception mixer MIXER, and an RF reception local oscillator RF_OSC.

An RF reception input signal received by a transmission/reception antenna ANT mounted on a cellular phone is supplied to an input terminal of the low noise amplifier LNA, and an RF reception amplification signal of an output terminal of the low noise amplifier LNA is supplied to one of input terminals of the reception mixer MIXER. Since an RF reception local signal having the same frequency as that of the RF reception input signal is supplied from the output terminal of the RF reception local oscillator RF_OSC to the other input terminal of the reception mixer MIXER, a differential reception baseband signal is generated from differential output terminals of the reception mixer MIXER. The differential reception baseband signal is supplied as an input signal voltage $V_{IN}$ to a non-inversion input terminal INT and an inversion input terminal INB of the active RC low-pass filter 300 having the biquad configuration.

As illustrated in FIG. 6, in the direct conversion receiver provided in the semiconductor integrated circuit IC, the active RC low-pass filter 300 having the biquad configuration, the voltage comparator CMP, the offset cancellation control circuit 100, and the digital-to-analog converter DAC0 form a feedback path, and the active RC low-pass filter 300 having the biquad configuration disposed in the feedback path has a second-order lag element due to the four capacitors C1.

Therefore, to cancel the DC offset voltage $V_{OS1}$ caused by the "LO leak" by the feedback path in the direct conversion receiver provided in the semiconductor integrated circuit IC illustrated in FIG. 6, the active RC low-pass filter 300 having the biquad configuration disposed in the feedback path comes to have lag time caused by the lag element of the four capacitors C1. As a result, the problems such that the DC offset cancelling operation period of the DC offset cancellation circuit becomes longer and the reception start time of starting the normal receiving operation of the direct conversion receiver delays were made clear by the investigation conducted by the inventors of the present invention previously to the present invention.

The present invention has been achieved as a result of the investigation of the inventors of the present invention previously to the present invention.

An object of the present invention is, therefore, to shorten the period of the DC offset cancelling operation.

Another object of the present invention is to shorten the period of the DC offset cancelling operation of the direct conversion receiver provided in the semiconductor integrated circuit.

Further another object of the present invention is to lessen delay of the reception start time of starting the normal receiving operation after the DC offset cancelling operation of the direct conversion receiver provided in the semiconductor integrated circuit.

The above and other objects and novel features of the present invention will become apparent from the description of the specification and the appended drawings.

A representative one of inventions disclosed in the present application will be briefly described as follows.

A semiconductor integrated circuit according to a representative embodiment of the present invention includes: an active low-pass filter (300) having a filter processing function and an amplifying function; two calibration resistors (R22, R22) coupled or connected to differential output terminals of the active low-pass filter; a voltage comparator (CMP) coupled or connected to the differential output terminals of the active low-pass filter via the two calibration resistors; a control circuit (100) generating a digital control signal on the basis of an output signal of the voltage comparator and outputting the signal; a digital-to-analog converter (DAC0) converting the digital control signal output from the control circuit into a calibration analog current and outputting the current; and a switch (SWIO) for switching coupling of an output terminal of the digital-to-analog converter between the two calibration resistors and differential input terminals of an operational amplifier in a first stage in the active low-pass filter.

In a calculation period as a period of calculating the digital control signal for reducing the DC offset voltage between the differential output terminals of the active low-pass filter, the control circuit calculates the digital control signal by detecting calibration voltage between the two input terminals depending on voltage drop in at least one of the two calibration resistors caused by the calibration analog current flowing in an analog current output terminal of the digital-to-analog converter by the voltage comparator.

In a calibration period as a period of reducing the DC offset voltage after the calculation period, the calibration analog current as an output signal of the digital-to-analog converter responding to the digital control signal calculated by the control circuit flows in at least one of the differential input terminals of the operational amplifier in the first stage via the switch (refer to FIG. 7).

An effect obtained by the representative one of the inventions disclosed in the present application will be briefly described as follows.

According to the present invention, the period of the DC offset cancellation operation can be shortened.

DETAILED DESCRIPTION

1. Outline of Embodiments

Figure 1:
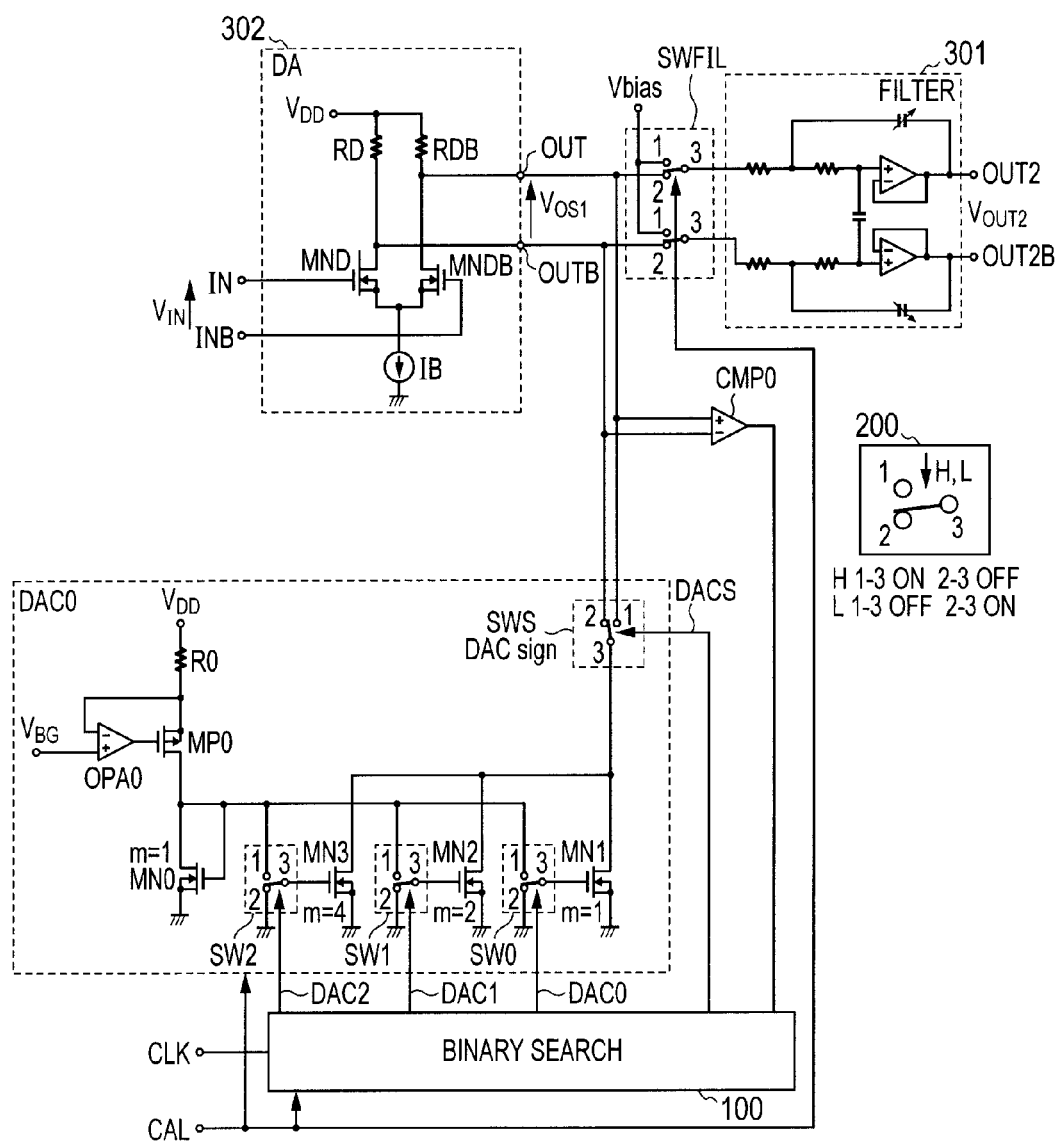
FIG. 1 is a diagram illustrating a configuration of a DC offset cancellation circuit for cancelling DC offset voltage of a baseband amplification signal of a receiver of a direct conversion receiver provided in a semiconductor integrated circuit investigated by the inventors of the present invention previously to the present invention.
Figure 2:
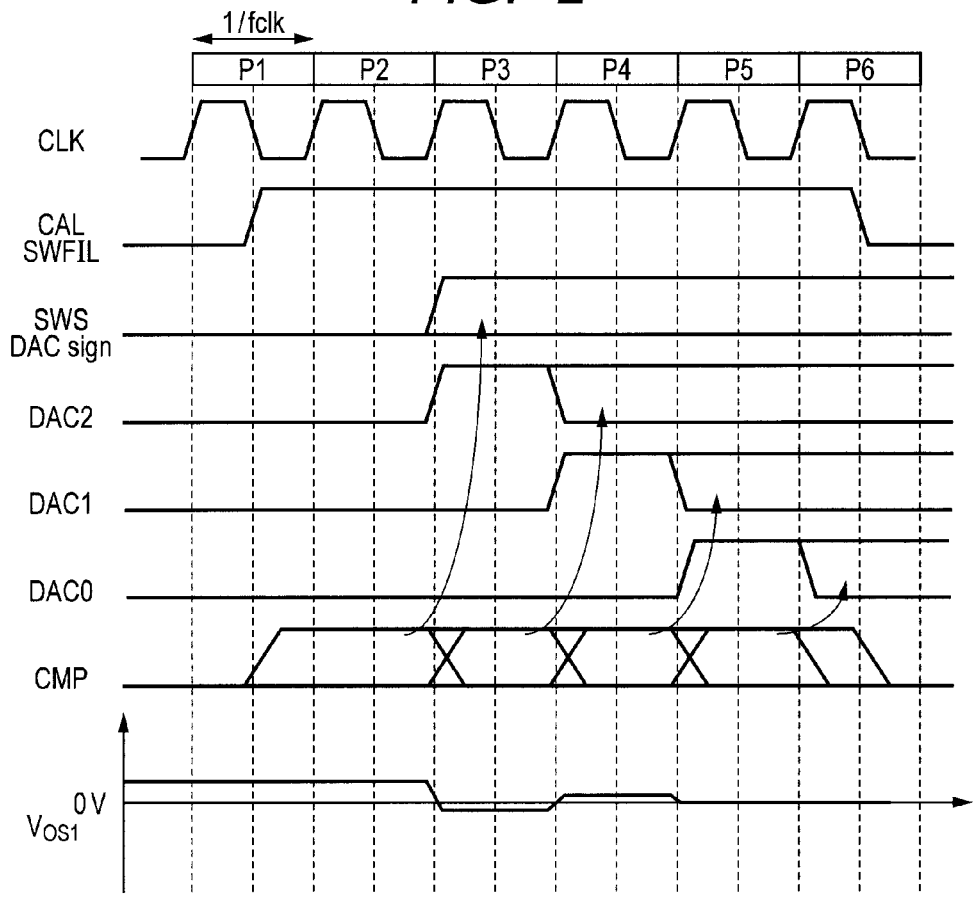
FIG. 2 is a diagram for explaining DC offset cancelling operation of the DC offset cancellation circuit provided in the semiconductor integrated circuit investigated by the inventors of the present invention previously to the present invention illustrated in FIG. 1.

First, outline of representative embodiments of the invention disclosed in the present application will be described. Reference numerals of the drawings referred to in parentheses in the description of the outline of the representative embodiments merely illustrate components designated with the reference numerals included in the concept of the components.

[1] A semiconductor integrated circuit according to a representative embodiment of the invention includes: an active low-pass filter (300) having a filter processing function and an amplifying function; two calibration resistors (R22 and R22) coupled or connected to differential output terminals of the active low-pass filter; a voltage comparator (CMP) coupled or connected to the differential output terminals of the active low-pass filter via the two calibration resistors; a control circuit (100) generating a digital control signal on the basis of an output signal of the voltage comparator and outputting the signal; a digital-to-analog converter (DAC0) converting the digital control signal output from the control circuit into a calibration analog current and outputting the current; and a switch (SWIO) for switching coupling of an output terminal of the digital-to-analog converter between the two calibration resistors and between differential input terminals of an operational amplifier in a first stage in the active low-pass filter.

In a calculation period of calculating the digital control signal for reducing the DC offset voltage between the differential output terminals of the active low-pass filter, the control circuit calculates the digital control signal by detecting calibration voltage between the two input terminals depending on voltage drop in at least one of the two calibration resistors caused by the calibration analog current flowing in an analog current output terminal of the digital-to-analog converter by the voltage comparator.

Figure 7:
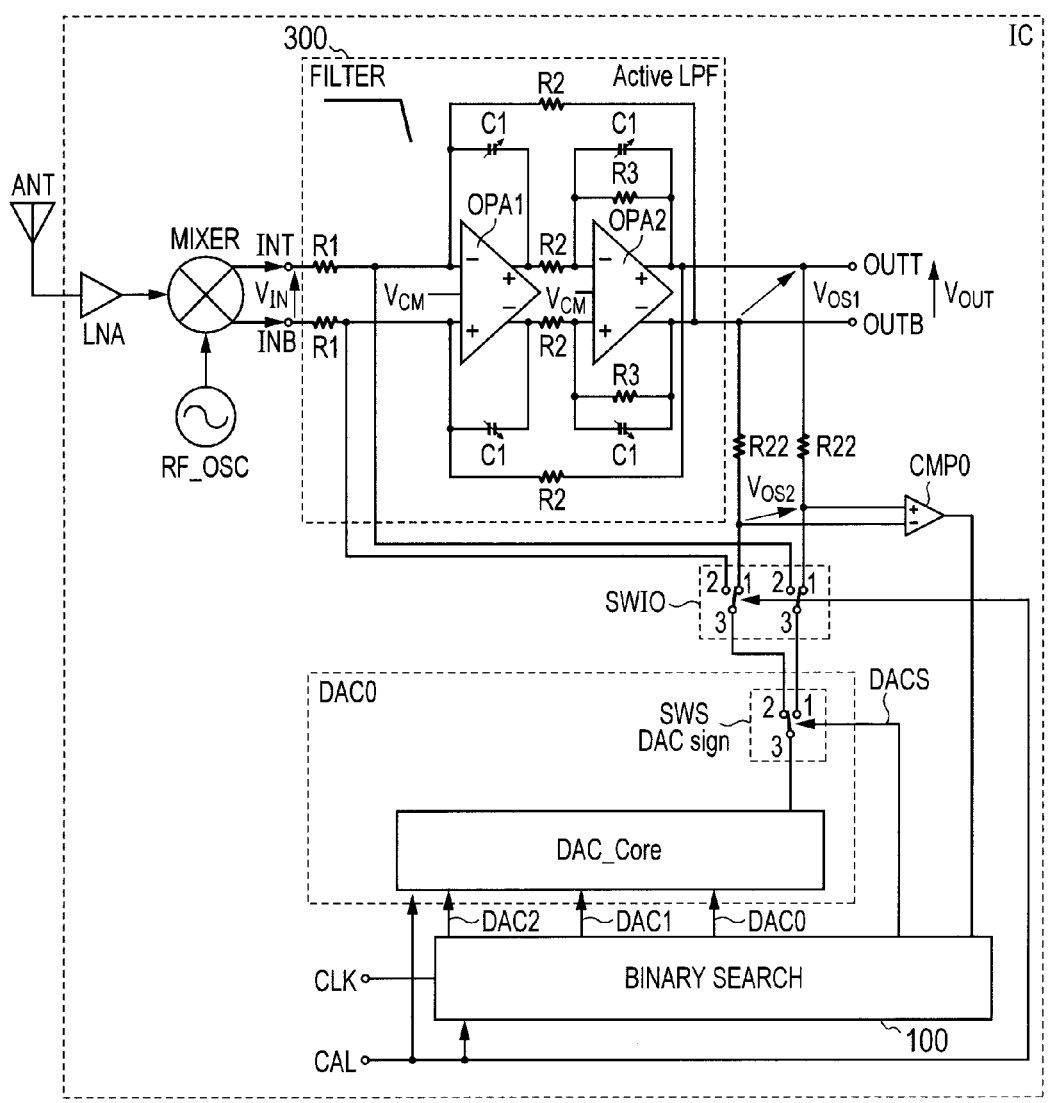
FIG. 7 is a diagram showing a configuration of a DC offset cancellation circuit for cancellation of a DC offset voltage of a baseband amplification signal of a direct conversion receiver provided in a semiconductor integrated circuit according to a first embodiment of the invention.

In a calibration period of reducing the DC offset voltage after the calculation period, the calibration analog current as an output signal of the digital-to-analog converter responding to the digital control signal calculated by the control circuit flows in at least one of the differential input terminals of the operational amplifier in the first stage via the switch (refer to FIG. 7).

According to the embodiment, the operation period of the DC offset cancelling operation can be shortened.

In a preferred embodiment, one of terminals of the two calibration resistors is coupled or connected to the differential output terminals of the active low-pass filter, and two input terminals of the voltage comparator and two first terminals of the switch (SWIO) are coupled or connected to the other terminal of the two calibration resistors.

Two second terminals of the switch are coupled or connected to differential input terminals of the operational amplifier in the first stage.

The output terminals of the digital-to-analog converter include a first analog current output terminal and a second analog current output terminal.

One of two third terminals of the switch is coupled or connected to the first analog current output terminal, and the other of the two third terminals of the switch is coupled or connected to the second analog current output terminal.

The control circuit supplies the digital control signal for reducing the DC offset voltage between the differential output terminals of the active low-pass filter to a digital input terminal of the digital-to-analog converter in response to a voltage comparison result of the voltage comparator.

In the calculation period, the control circuit controls the two first terminals and the two third terminals of the switch to be in a conductive state, and controls the two second terminals and the two third terminals of the switch to be in a non-conductive state.

In the calibration period, the control circuit controls the two first terminals and the two third terminals of the switch to be in a non-conductive state, and controls the two second terminals and the two third terminals of the switch to be in a conductive state (refer to FIG. 7).

In another preferred embodiment, the active low-pass filter (300) includes two first resistors (R1, R1), an operational amplifier (OPA1) in a first stage, two first capacitors (C1, C1), two second resistors (R2, R2), an operational amplifier (OPA2) in a second stage, two second capacitors (C2, C2), two third resistors (R3, R3), and two feedback resistors (R2, R2).

A differential input signal ($V_{IN}$) can be supplied to an inversion input terminal and a non-inversion input terminal of the operational amplifier in the first stage via the two first resistors, and the two first capacitors are coupled or connected between the inversion input terminal and the non-inversion input terminal of the operational amplifier in the first stage and a non-inversion output terminal and an inversion output terminal.

The non-inversion output terminal and the inversion output terminal of the operational amplifier in the first stage are coupled or connected to an inversion input terminal and a non-inversion input terminal of the operational amplifier in the second stage via the two second resistors, the two second capacitors are coupled or connected between the inversion input terminal and the non-inversion input terminal and a non-inversion output terminal and an inversion output terminal of the operational amplifier in the second stage, and the two third resistors are coupled or connected between the inversion input terminal and the non-inversion input terminal of the operational amplifier in the second stage and the non-inversion output terminal and the inversion output terminal.

The two feedback resistors are coupled or connected between the non-inversion output terminal and the inversion output terminal of the operational amplifier in the second stage and the inversion input terminal and the non-inversion input terminal of the operational amplifier in the first stage (refer to FIG. 7).

In another preferred embodiment, a resistance value of the two calibration resistors is set to be substantially equal to that of the two feedback resistors (refer to FIG. 7).

In further another preferred embodiment, in the calculation period, the control circuit (100) determines to which one of the first and second analog current output terminals of the digital-to-analog converter the calibration analog current as the output signal of the digital-to-analog converter is passed in response to a first voltage comparison result generated from the voltage comparator.

Which one of the first and second analog current output terminals of the digital-to-analog converter the calibration analog current is passed is determined on the basis of a signal of a most significant bit of the digital control signal generated from the control circuit (refer to FIG. 7).

Figure 8:
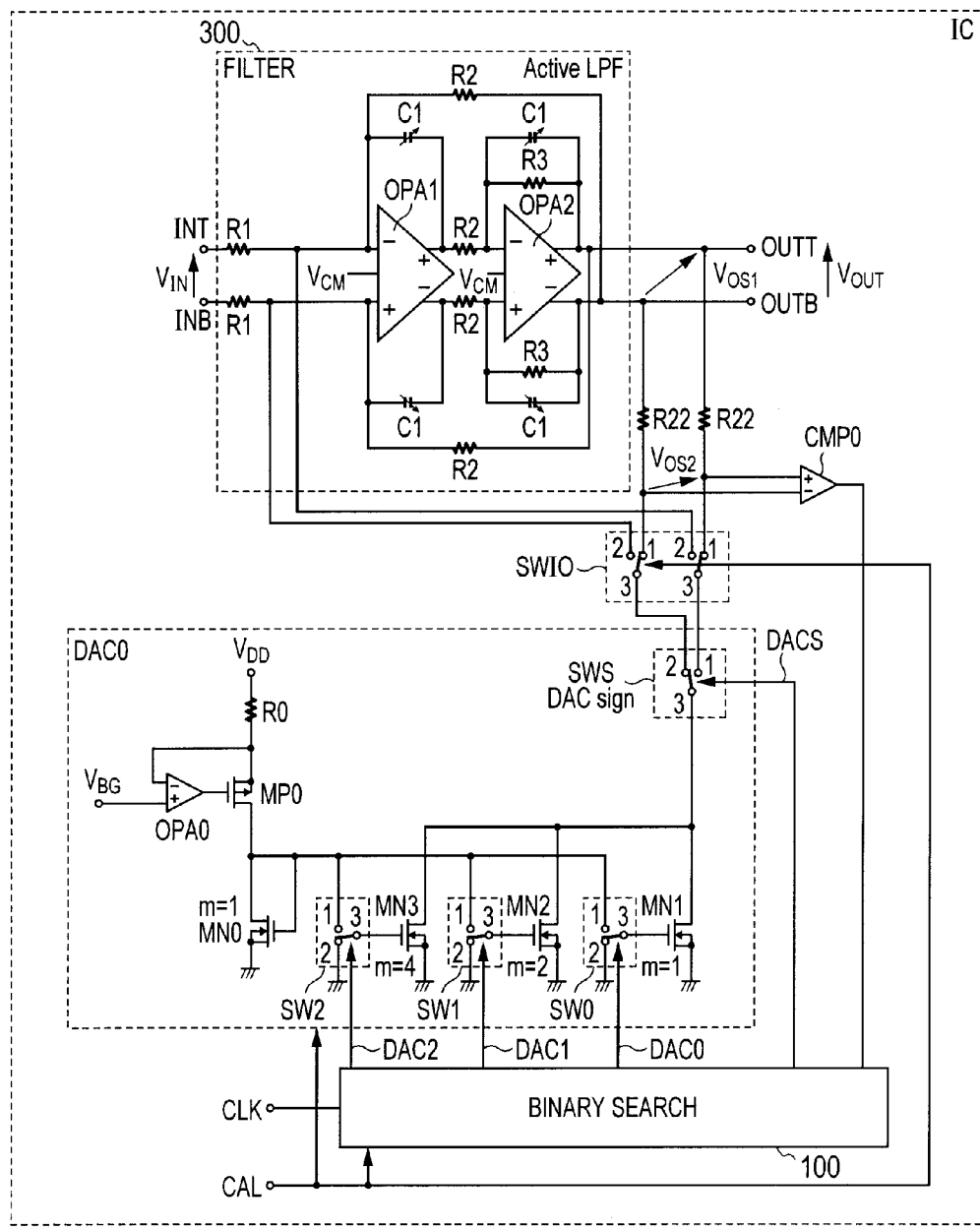
FIG. 8 is a more-detailed diagram of the configuration of the DC offset cancellation circuit for cancellation of a DC offset voltage of a baseband amplification signal of the direct conversion receiver provided in the semiconductor integrated circuit according to the first embodiment of the invention of FIG. 7.

In a more preferable embodiment, an absolute value of the calibration current is determined by a plurality of or set of signals of lower bits other than the most significant bit of the digital control signal generated from the control circuit (refer to FIG. 8).

In a further more preferable embodiment, the semiconductor integrated circuit further includes a low noise amplifier (LNA) as a component of a direct conversion receiver, an RF reception local oscillator (RF_OSC), and a reception mixer (MIXER).

An RF reception input signal received by an antenna of the receiver can be supplied to an input terminal of the low noise amplifier, and an RF reception amplification signal of an output terminal of the low noise amplifier can be supplied to one of input terminals of the reception mixer.

An RF reception local signal generated from the RF reception local oscillator can be supplied to the other input terminal of the reception mixer, and a differential reception baseband signal generated from a differential output terminal of the reception mixer can be supplied as the differential input signal to an inversion input terminal and a non-inversion input terminal of the operational amplifier in the first stage via the two first resistors (refer to FIG. 8).

Figure 10:
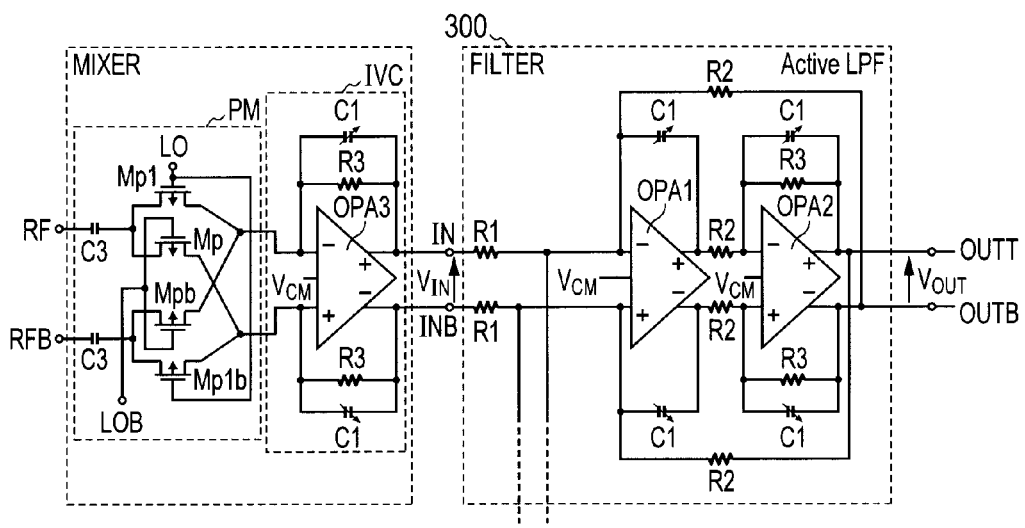
FIG. 10 is a diagram showing a configuration of a reception mixer MIXER of the direct conversion receiver provided in the semiconductor integrated circuit according to the first embodiment of the invention illustrated in FIG. 7.

In a further more preferred embodiment, the reception mixer includes a passive mixer (PM) and a current-to-voltage converter (IVC) for converting a current signal output from the passive mixer to a voltage signal (refer to FIG. 10).

Figure 11:
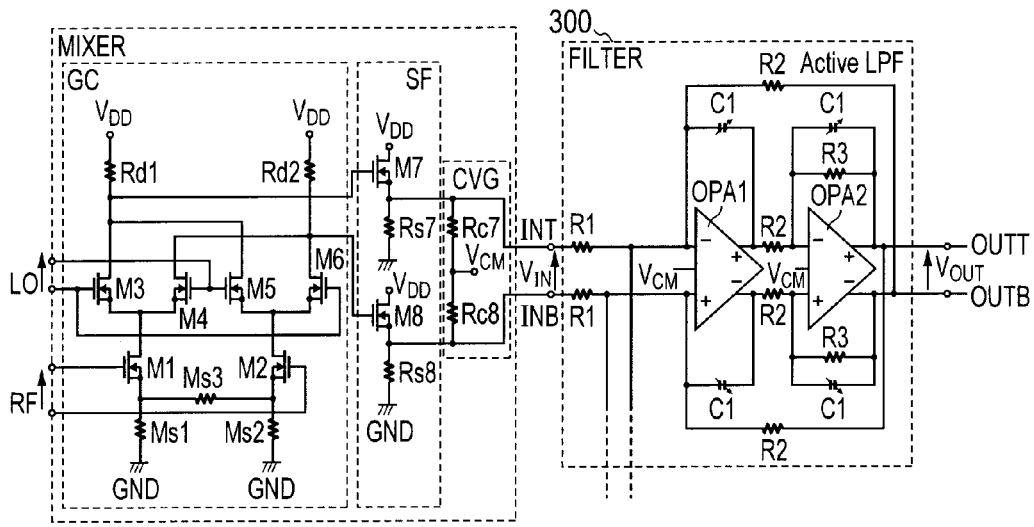
FIG. 11 is a diagram showing another configuration of the reception mixer MIXER of the direct conversion receiver provided in the semiconductor integrated circuit according to the first embodiment of the invention illustrated in FIG. 7.

In a concrete embodiment, the reception mixer includes a Gilbert cell GC as an active mixer (refer to FIG. 11).

Figure 12:
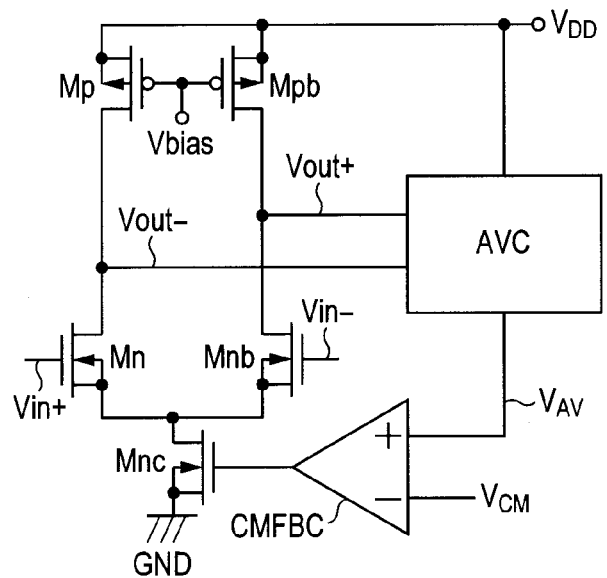
FIG. 12 is a diagram showing a configuration of an operational amplifier in a common-mode feedback circuit format which can be used as each of an operational amplifier OPA1 in the first stage and an operational amplifier OPA2 in the second stage of an active RC low-pass filter 300 having a biquad configuration of the direct conversion receiver provided in the semiconductor integrated circuit according to the first embodiment of the invention illustrated in FIG. 7.
Figure 13:
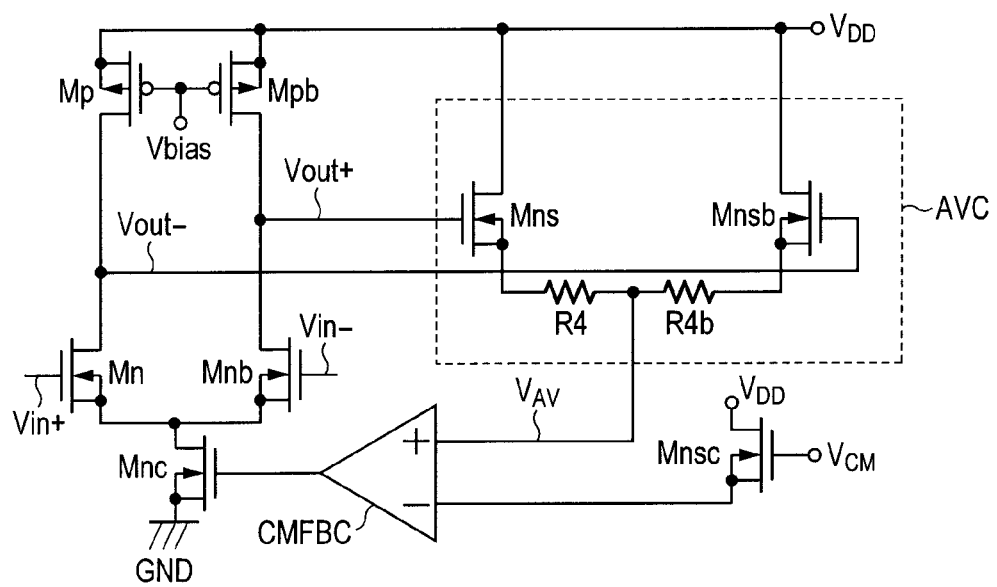
FIG. 13 is a diagram showing a configuration of an operational amplifier in a common-mode feedback circuit format which can be used more preferably as each of the operational amplifier OPA1 in the first stage and the operational amplifier OPA2 in the second stage of the active RC low-pass filter 300 having the biquad configuration of the direct conversion receiver provided in the semiconductor integrated circuit according to the first embodiment of the invention illustrated in FIG. 7.

In a most concrete embodiment, each of the operational amplifier in the first stage and the operational amplifier in the second stage in the active low-pass filter is an operation amplifier of a common mode feedback circuit format (refer to FIGS. 12 and 13).

[2] A representative embodiment of another aspect of the present invention relates to an operation method of a semiconductor integrated circuit including: an active low-pass filter (300) having a filter processing function and an amplifying function; two calibration resistors (R22, R22) coupled or connected to differential output terminals of the active low-pass filter; a voltage comparator (CMP) coupled or connected to the differential output terminals of the active low-pass filter via the two calibration resistors; a control circuit (100) generating a digital control signal on the basis of an output signal of the voltage comparator and outputting the signal; a digital-to-analog converter (DAC0) converting the digital control signal output from the control circuit into a calibration analog current and outputting the current; and a switch (SWIO) for switching coupling of an output terminal of the digital-to-analog converter between the two calibration resistors and between differential input terminals of an operational amplifier in a first stage in the active low-pass filter.

The method includes the steps of: in a calculation period of calculating the digital control signal for reducing the DC offset voltage between the differential output terminals of the active low-pass filter, calculating the digital control signal by the control circuit by detecting calibration voltage between the two input terminals depending on voltage drop in at least one of the two calibration resistors caused by the calibration analog current flowing in an analog current output terminal of the digital-to-analog converter by the voltage comparator; and in a calibration period of reducing the DC offset voltage after the calculation period, passing the calibration analog current as the output signal of the digital-to-analog converter responding to the digital control signal calculated by the control circuit into the differential input terminals of the operational amplifier in the first stage via the switch (refer to FIG. 7).

In the embodiment, the period of the DC offset cancelling operation can be shortened.

2. Details of Embodiments

Next, embodiments will be described more specifically. In all of the drawings for explaining the best modes for carrying out the invention, the same reference numerals are designated to parts having the same functions as those of the above-described drawings, and their description will not be repeated.

First Embodiment

Configuration of DC Offset Cancellation Circuit

FIG. 7 is a diagram illustrating the configuration of a DC offset cancellation circuit for cancelling a DC offset voltage of a baseband amplification signal of a direct conversion receiver provided in a semiconductor integrated circuit according to the first embodiment of the present invention.

Figure 6:
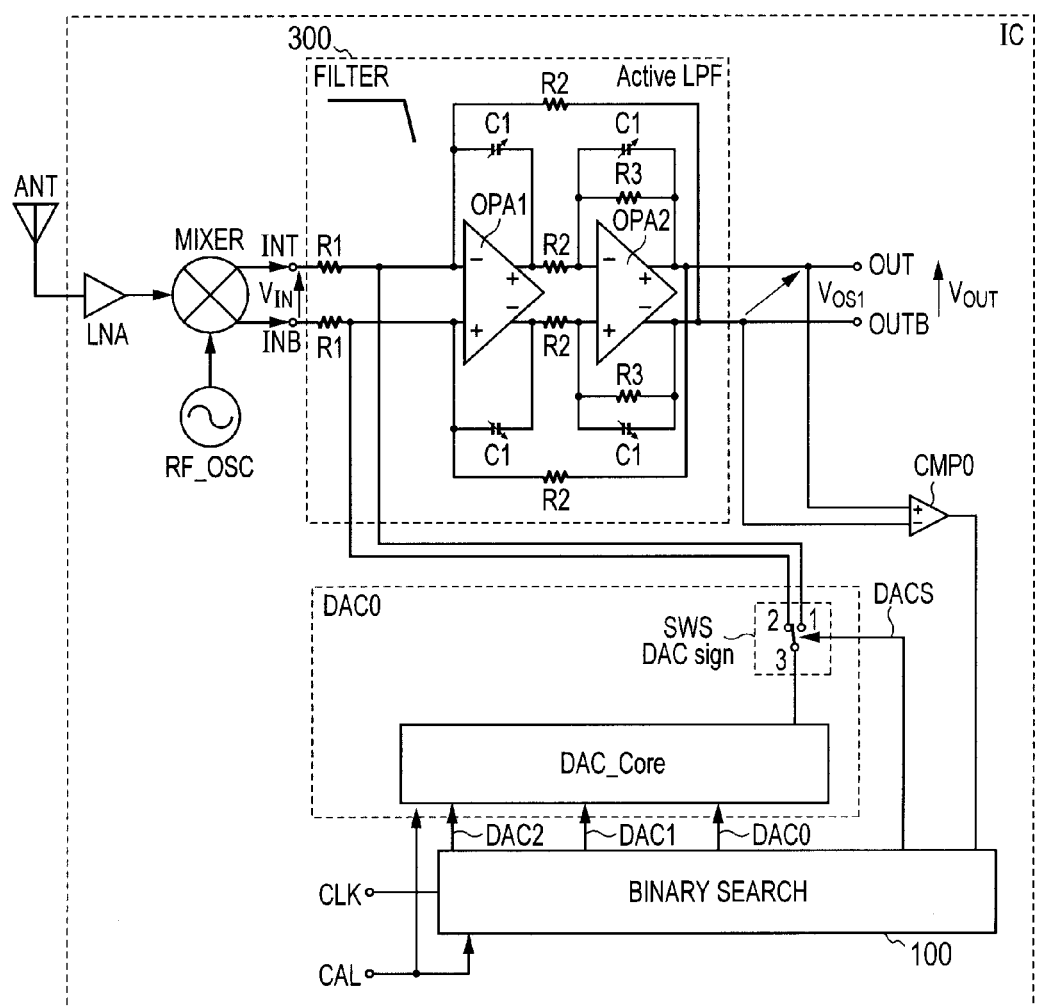
FIG. 6 is a diagram showing a state where a DC offset voltage of a baseband amplification signal of the direct conversion receiver provided in the semiconductor integrated circuit is cancelled by another DC offset cancellation circuit investigated by the inventors of the present invention previously to the present invention illustrated in FIG. 4.

A semiconductor integrated circuit IC according to the first embodiment of the invention illustrated in FIG. 7 differs from the semiconductor integrated circuit IC illustrated in FIG. 6 and investigated by the inventors of the present invention previously to the present invention with respect to the following point.

Specifically, as illustrated in FIG. 7, the semiconductor integrated circuit IC has therein a low noise amplifier LNA, a reception mixer MIXER, an RF reception local oscillator RF_OSC, an active RC low-pass filter 300 having a biquad configuration, a voltage comparator CMP, an offset cancellation control circuit 100, and a digital-to-analog converter DAC0 and, in addition, two resistors R22 and R22 and a switch SWIO.

In the DC offset cancellation circuit according to the first embodiment of the invention illustrated in FIG. 7, the two resistors R22 and R22 which are set to a resistance value almost equal to that of two feedback resistors R2 of the active RC low-pass filter 300 having the biquad configuration are coupled or connected to differential output terminals OUTT and OUTB of the active RC low-pass filter 300 having the biquad configuration. Specifically, one end of the resistor R22 as one of the resistors and one end of the other resistor R22 are coupled or connected to the non-inversion differential output terminal OUTT and the inversion differential output terminal OUTB, respectively. The other end of the resistor R22 as one of the resistors and the other end of the other resistor R22 are coupled or connected to the non-inversion input terminal and the inversion input terminal of the voltage comparator CMP0, respectively.

Further, one of terminals 1 of the switch SWIO and the other terminal 1 are coupled or connected to the other end of one of the resistors R22 and the other end of the other resistor R22, respectively. One of terminals 2 of the switch SWIO and the other terminal 2 are coupled or connected to an inversion input terminal − of the operational amplifier OPA1 in the first stage and the non-inversion terminal +, respectively. One of terminals 3 of the switch SWIO and the other terminal 3 are coupled or connected to the terminal 1 and the terminal 2 of a polarity switch SWS of the digital-to-analog converter DAC0, respectively.

The switch changing operation of the switch SWIO is controlled by an offset compensation start signal CAL supplied to the offset cancellation control circuit 100. Specifically, in the case where the offset compensation start signal CAL is at the high level H "1", one of the terminals 1 and the other terminal 1 are coupled or connected to one of the terminals 3 and the other terminal 3, respectively, in the switch SWIO in the on state. One of the terminals 2 and the other terminal 2 are not coupled or connected to one of the terminals 3 and the other terminal 3, respectively, in an off state. On the other hand, in the case where the offset compensation start signal CAL is at the low level L "0", one of the terminals 1 and the other terminal 1 are not coupled or connected to one of the terminals 3 and the other terminal 3, respectively, in the switch SWIO in the off state. One of the terminals 2 and the other terminal 2 are coupled or connected to one of the terminals 3 and the other terminal 3, respectively, in an on state.

In the semiconductor integrated circuit IC according to the first embodiment of the invention illustrated in FIG. 7, an RF reception input signal of a transmission/reception antenna ANT mounted on a cellular phone is supplied to the input terminal of the low noise amplifier LNA, an RF reception amplified signal at the output terminal of the low noise amplifier LNA is supplied to one of input terminals of the reception mixer MIXER. An RF reception local signal having the same frequency as the RF frequency of the RF reception input signal is supplied from the output terminal of the RF reception local oscillator RF_OSC to the other input terminal of the reception mixer MIXER, so that a differential reception baseband signal is generated from the differential output terminals of the reception mixer MIXER. The differential reception baseband signal is supplied as an input signal voltage $V_{IN}$ to a non-inversion input terminal INT and an inversion input terminal INB of the active RC low-pass filter 300 having the biquad configuration.

In the active RC low-pass filter 300 having the biquad configuration of the DC offset cancellation circuit illustrated in FIG. 7, the first stage is configured by a perfect integrator, and the second stage is configured by an imperfect integrator in which a feedback capacitor C1 is discharged by a variable feedback capacitor R3.

That is, in the channel filter shown in FIG. 7, the non-inversion input terminal INT and the inversion input terminal INB are coupled or connected to the non-inversion input terminal − and the non-inversion input terminal + of the operational amplifier OPA1 in the first stage via the resistors R1 and R1, respectively. The feedback capacitor C1 is coupled or connected between the inversion input terminal − and the non-inversion output terminal + of the operational amplifier OPA1 in the first stage, and the feedback capacitor C1 is coupled or connected between the non-inversion input terminal + and the inversion output terminal − of the operational amplifier OPA1 in the first stage. The non-inversion output terminal + and the inversion output terminal − of the operational amplifier OPA1 in the first stage are coupled or connected to the inversion input terminal − and the non-inversion input terminal + of the operational amplifier OPA2 in the second stage via the resistors R2 and R2, respectively. The feedback capacitor C1 and the variable feedback resistor R3 are coupled or connected in parallel between the inversion input terminal − and the non-inversion output terminal + of the operational amplifier OPA2 in the second stage, and the feedback capacitor C1 and the variable feedback resistor R3 are coupled or connected in parallel between the non-inversion input terminal + and the inversion output terminal − of the operational amplifier OPA2 in the second stage. The feedback resistor R2 is coupled or connected between the inversion output terminal − of the operational amplifier OPA2 in the second stage and the inversion input terminal − of the operational amplifier OPA1 in the first stage, and the feedback resistor R2 is coupled or connected between the non-inversion output terminal + of the operational amplifier OPA2 in the second stage and the non-inversion input terminal + of the operational amplifier OPA1 in the first stage. The non-inversion output terminal + and the inversion output terminal − of the operational amplifier OPA2 in the second stage are set as the non-inversion output terminal OUTT and the inversion output terminal OUTB.

Figure 4:
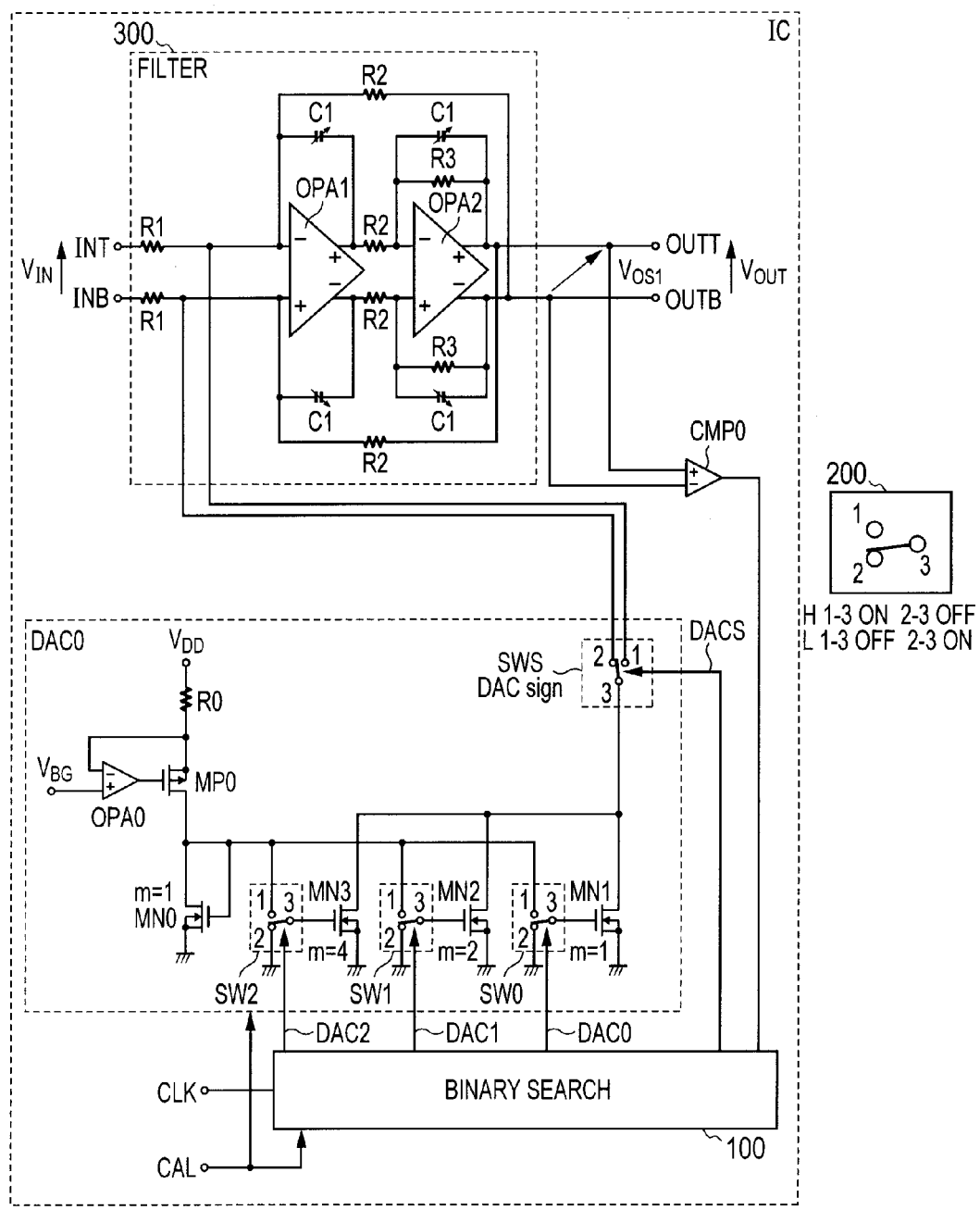
FIG. 4 is a diagram showing a configuration of another DC offset cancellation circuit for cancelling DC offset voltage of a baseband amplification signal of a direct conversion receiver provided in the semiconductor integrated circuit investigated by the inventors of the present invention previously to the present invention.
Figure 5:
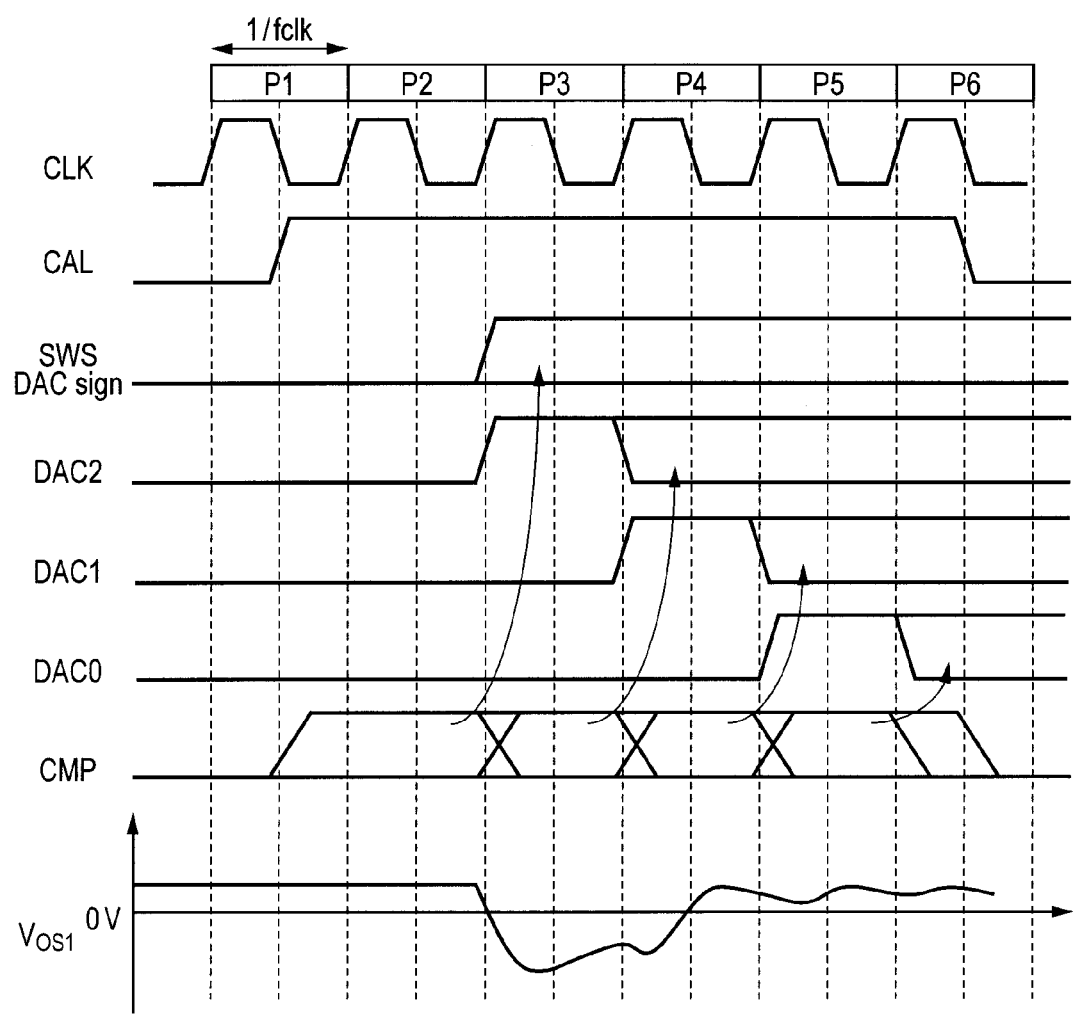
FIG. 5 is a diagram for explaining DC offset cancelling operation of another DC offset cancellation circuit investigated by the inventors of the present invention previously to the present invention illustrated in FIG. 4.

Therefore, in a manner similar to the channel filter investigated by the inventors of the present invention previously to the present invention shown in FIG. 4, in the channel filter illustrated in FIG. 7, a transfer function $H(s)=V_{OUT}/V_{IN}$ indicative of the relation between the input signal voltage $V_{IN}$ supplied across the non-inversion input terminal INT and the inversion input terminal INB of the active RC low-pass filter 300 having the biquad configuration and the output signal voltage $V_{OUT}$ generated between the non-inversion output terminal OUTT and the inversion output terminal OUTB is given by the above equation (2). Further, a natural frequency $\omega_0$, a performance index Q, and a voltage gain K are given by the above equations (3), (4), and (5), respectively. As a result, the active RC low-pass filter 300 having the biquad configuration of the DC offset cancellation circuit illustrated in FIG. 7 has the two functions of the filter process and the amplification function (voltage gain) like in the case of FIG. 4.

By supplying a common mode voltage $V_{CM}$ as a DC bias voltage level of the non-inversion input terminal + and the inversion input terminal − to each of the operational amplifier OPA1 in the first stage and the operational amplifier OPA2 in the second stage, common voltage of the inversion input terminal − and the non-inversion output terminal + of each of the operational amplifiers is detected. The bias current in each of the operational amplifiers is adjusted so that the detected common voltage of the inversion input terminal − and the non-inversion output terminal + coincides with the common mode voltage $V_{CM}$. By using the operational amplifiers in the common mode feedback circuit format using the common mode voltage $V_{CM}$, in each of the operational amplifier OPA1 in the first stage and the operational amplifier OPA2 in the second stage, input common voltage of the inversion input terminal − and the non-inversion input terminal + and output common voltage of the non-inversion output terminal + and the inversion output terminal − become almost the same voltage level, so that the DC current in the resistors R2 and R3 of the active RC low-pass filter 300 having the biquad configuration can be reduced to almost zero.

The direct conversion receiver provided in the semiconductor integrated circuit according to the first embodiment of the invention illustrated in FIG. 7 executes DC offset cancelling operation to be described later in an initial sequence at the time of power on of a cellular phone, just before start of speech, or the like.

That is, the voltage of one of the terminals 1 and that of the other terminal 1 of the switch SWIO depending on the voltage level of a DC offset voltage $V_{OS1}$ of the differential output terminals OUTT and OUTB of the active RC low-pass filter 300 having the biquad configuration are detected by the voltage comparator CMP, and a detection result of the voltage comparator CMP is supplied to the offset cancellation control circuit 100. The offset cancellation control circuit 100 generates digital signals DACS, DAC2, DAC1, and DAC0 of a plurality of or set of bits in accordance with a predetermined search algorithm in response to the detection result of the voltage comparator CMP and supplies the signals to digital input terminals of the digital-to-analog converter DAC0. As a result, analog output currents responding to the digital signals DACS, DAC2, DAC1, and DAC0 of a plurality of or set of bits flow in the analog output terminals of the digital-to-analog converter DAC0. Therefore, the analog output current of the digital-to-analog converter DAC0 flows to one of the two resistors R22 and R22 via the switch SWIO and, by a voltage drop of the one of the resistors R22, the voltage at one of the terminals 1 and that at the other terminal 1 of the switch SWIO are controlled to the same voltage level. In such a manner, a DC offset cancellation condition for controlling the DC offset voltage $V_{OS}$ between the differential output terminals OUTT and OUTB of the active RC low-pass filter 300 having the biquad configuration (a DAC code for controlling the DC offset voltage $V_{OS1}$ to almost zero) is calculated by the offset cancellation control circuit 100.

When calculation of the DC offset cancellation condition in the offset cancellation control circuit 100 is completed, the offset compensation start signal CAL changes from the high level H "1" to the low level L "0", in the switch SWIO, the one of the terminals 1 and the other terminal 1 are not coupled or connected to one of the terminals 3 and the other terminal 3, respectively, in the off state. On the other hand, one of the terminals 2 and the other terminal 2 are coupled or connected to one of the terminals 3 and the other terminal 3, respectively, in the on state. Therefore, in the direct conversion receiver provided in the semiconductor integrated circuit according to the first embodiment of the invention illustrated in FIG. 7, the voltage drop in one of the two negative feedback resistors R2 and R2 of the active RC low-pass filter 300 having the biquad configuration is increased by the analog output current of the digital-to-analog converter DAC0, so that the voltage level of the DC offset voltage $V_{OS1}$ of the differential output terminals OUTT and OUTB of the filter 300 is controlled to almost zero.

Particularly, in the direct conversion receiver provided in the semiconductor integrated circuit according to the first embodiment of the invention illustrated in FIG. 7, in the calculation period in which the offset cancellation control circuit 100 calculates the DC offset cancellation condition in order to control the DC offset voltage $V_{OS1}$ between the differential output terminals OUTT and OUTB of the active RC low-pass filter 300 having the biquad configuration, the active RC low-pass filter 300 having the biquad configuration having a lag element is disposed on the outside of a feedback path configured by the voltage comparator CMP0, the offset cancellation control circuit 100, and the digital-to-analog converter DAC0.

Therefore, in the direct conversion receiver provided in the semiconductor integrated circuit according to the first embodiment of the invention illustrated in FIG. 7, even if the active RC low-pass filter 300 having the biquad configuration has a second-order lag element due to the four capacitors C1, occurrence of large lag time caused by the lag element of the four capacitors C1 can be prevented in the active RC low-pass filter 300 having the biquad configuration.

FIG. 8 is a more-detailed diagram of the configuration of the DC offset cancellation circuit for cancellation of a DC offset voltage of a baseband amplification signal of the direct conversion receiver provided in the semiconductor integrated circuit according to the first embodiment of the invention of FIG. 7.

As illustrated in FIG. 8, the digital-to-analog converter DAC generates analog output currents corresponding to the digital DAC code input signals DACS, DAC2, DAC1, and DAC0 of a plurality of or set of bits (hereinbelow, called DAC codes). That is, the digital-to-analog converter DAC0 is called a current steering D/A converter (DAC). The DAC code input signal DACS of the most significant bit (MSB) indicates the sign of the analog output current and the DAC code input signals DAC2, DAC1, and DAC0 of the lower bits and the least significant bit (LSB) indicate the absolute values of the analog output currents. The relations between the DAC codes and the DAC code input signals DACS, DAC2, DAC1, and DAC0 of the plurality of or set of bits has been already described with reference to FIG. 1.

In the digital-to-analog converter DAC0 illustrated in FIG. 8, in a manner similar to the case of FIG. 1, DC reference voltage $V_{BG}$ is converted to current by the operational amplifier circuit OPA0, a P-channel MOS transistor MP0, and a resistor R0. When power supply voltage is $V_{DD}$, DC reference current $I_{REF}$ given by the equation (1) flows from the drain of the P-channel MOS transistor MP0 to the drain of the N-channel MOS transistor MN0.

All of N-channel MOS transistors MN0, MN1, MN2, and MN3 illustrated in FIG. 8 have the same characteristics and, in a manner similar to the case of FIG. 1, the integer expressed by the sign "m" in FIG. 8 indicates the number of N channel MOS transistors coupled or connected in parallel.

For example, only one transistor MN1 of m=1 exists, and the transistors MN3 of m=4 having the same size as that of four transistors MN1 are coupled or connected in parallel. In such arrangement, by turning on a switch SW0 by the DAC code input signal DAC0 of the least significant bit (LSB) of the high level H, the current $I_{REF}$ flows in the drain of the N-channel MOS transistor MN1. By turning on a switch SW1 by the DAC code input signal DAC1 of the second bit of the high level H, current $2 \times I_{REF}$ flows in the drain of the N-channel MOS transistor MN2. By turning on a switch SW2 by the DAC code input signal DAC2 of the third bit of the high level H, current $4 \times I_{REF}$ flows in the drain of the N-channel MOS transistor MN3. When the switches SW0, SW1, and SW2 are turned off, the drain currents in the N-channel MOS transistors MN0, MN1, and MN2 become zero. Therefore, since the switches SW0, SW1, SW2, and SWS perform the on/off operation in accordance with a switch polarity diagram 200 in FIG. 1 in response to the high level H=1 and the low level L=0 of the DAC code to the DAC code input signals DAC2, DAC1, and DAC0, analog output current $I_{DACout}$ of the digital-to-analog converter DAC0 becomes as follows.

That is, in the DC offset cancellation circuit illustrated in FIG. 8, when DACS=0, $I_{DACout}$ (terminal 1 in SWS)=0 and $I_{DACout}$ (terminal 2 in SWS)=(4×DAC2+2×DAC1+DAC0)× $I_{REF}$. When DACS=1, $I_{DACout}$ (terminal 1 in SWS)=(4× DAC2+2×DAC1+DAC0)×$I_{REF}$ and $I_{DACout}$ (terminal 2 in SWS)=0.

Also in the DC offset cancellation circuit illustrated in FIG. 8, when the current passed to the terminal 2 side in the polarity switch SWS is positive, the analog output current $I_{DACout}$ of the digital-to-analog converter DAC0 becomes as follows.

$$I_{DACout} = I_{DACout} \text{ (terminal 2 in SWS)} - I_{DACout} \text{ (terminal 1 in SWS)}$$

Figure 3:
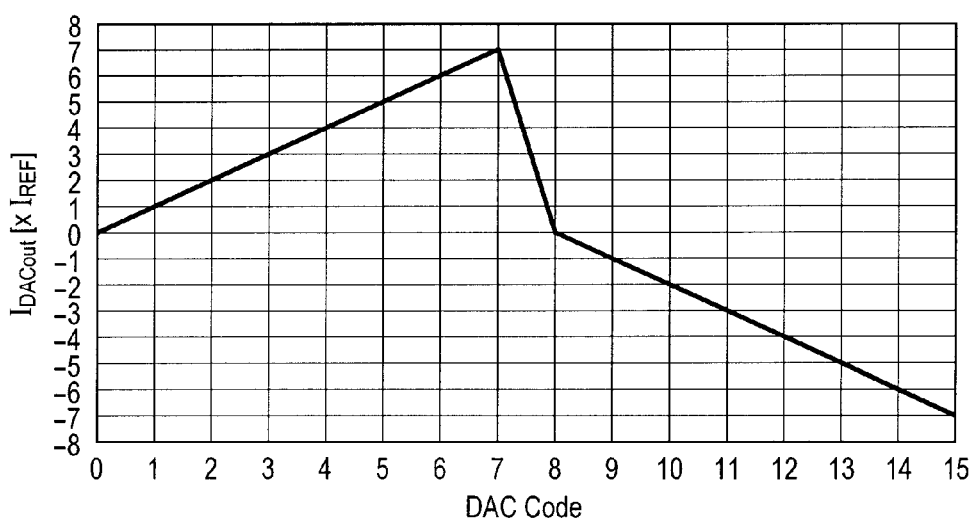
FIG. 3 is a diagram showing the relation between analog output current $I_{DACout}$ and a DAC code of a digital-to-analog converter DAC0 in the DC offset cancellation circuit provided in the semiconductor integrated circuit investigated by the inventors of the present invention previously to the present invention and is a diagram showing the relation between analog output current $I_{DACout}$ and a DAC code of a digital-to-analog converter DAC0 in the DC offset cancellation circuit provided in the semiconductor integrated circuit according to a first embodiment of the present invention of FIG. 7.

FIG. 3 is a diagram showing the relation between the analog output current $I_{DACout}$ of the digital-to-analog converter DAC0 in the DC offset cancellation circuit provided in the semiconductor integrated circuit according to the first embodiment of the present invention illustrated in FIG. 7 and a DAC code.

As illustrated in FIG. 3, the analog output current $I_{DACout}$ increases from 0 to $7 \times I_{REF}$ with respect to the DAC codes from 0 to 7 and, on the other hand, decreases from 0 to $-7 \times I_{REF}$ with respect to the DAC codes from 8 to 15.

Operation of DC Offset Cancellation Circuit

Figure 9:
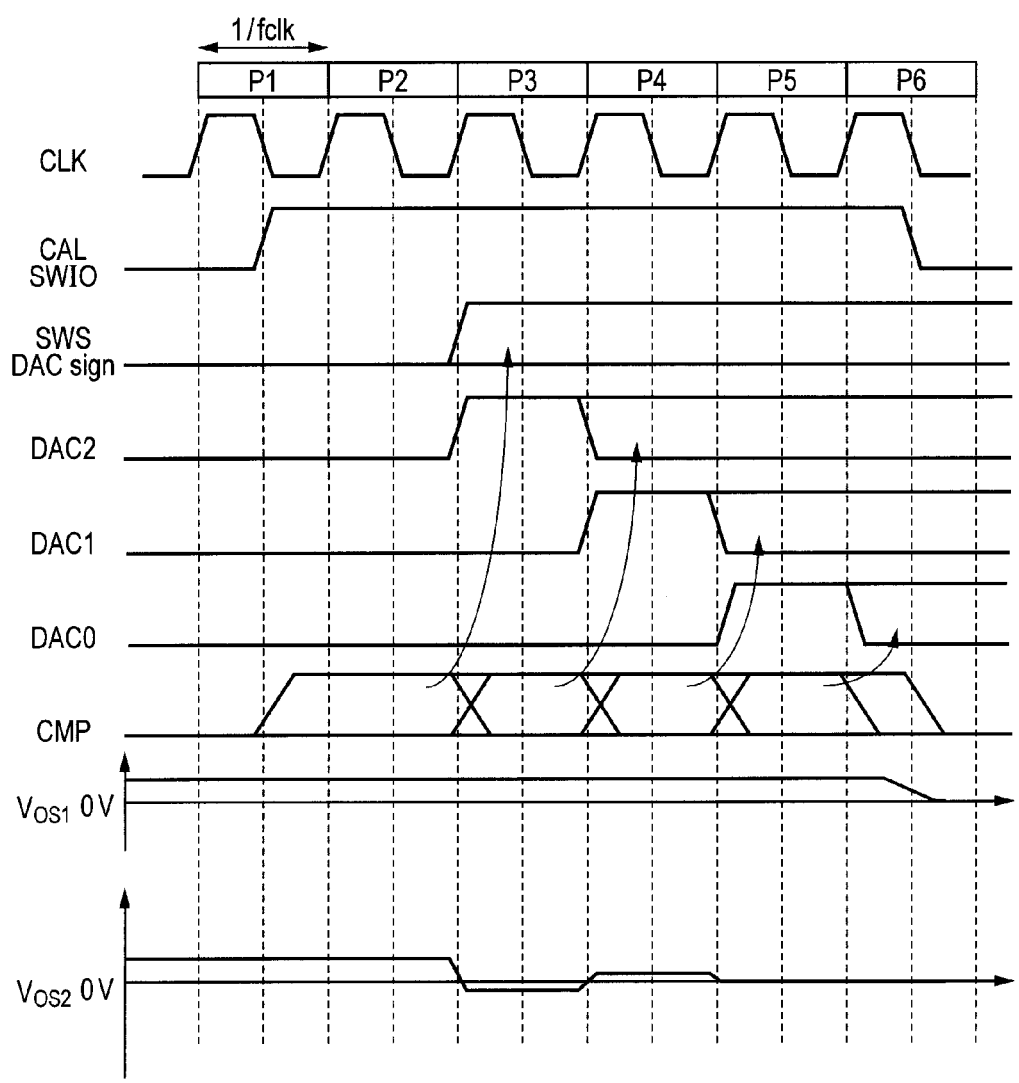
FIG. 9 is a diagram for explaining DC offset cancelling operation of the DC offset cancellation circuit for cancelling the DC offset voltage of the baseband amplification signal of the direct conversion receiver provided in the semiconductor integrated circuit according to the first embodiment of the invention of FIG. 8.

FIG. 9 is a diagram for explaining DC offset cancelling operation of the DC offset cancellation circuit for cancelling the DC offset voltage of the baseband amplification signal of the direct conversion receiver provided in the semiconductor integrated circuit according to the first embodiment of the invention of FIG. 8.

As illustrated in the timing chart of FIG. 9, a clock signal CLK is supplied to the clock signal input terminal of the offset cancellation control circuit 100. On start of the DC offset cancelling operation, the offset compensation start signal CAL of the high level H "1" is supplied to the offset cancellation control circuit 100 and the switch SWIO. Therefore, in the switch SWIO, one of the terminals 1 and the other terminal 1 are coupled or connected to the one of the terminals 3 and the other terminal 3, respectively, in the on state, and one of the terminals 2 and the other terminal 2 are coupled or connected to the one of the terminals 3 and the other terminal 3, respectively, in the off state. In the timing chart of FIG. 9, P1 to P6 shown above the clock signals CLK indicate the numbers of the clock signals CLK.

At the negative edge of the first clock signal CLK P1, the offset compensation start signal CAL of the high level H "1" is supplied to start the DC offset cancelling operation by the DC offset cancellation circuit illustrated in FIG. 8. When the offset compensation start signal CAL of the high level H "1" is supplied at the negative edge of the first clock signal CLK P1, the digital signals DACS, DAC2, DAC1, and DAC0 of the plurality of or set of bits are still in the low level L "0".

In the timing chart of FIG. 9, the first DC offset voltage $V_{OS1}$ of the differential output terminals OUTT and OUTB of the active RC low-pass filter 300 having the biquad configuration is, as an example, positive DC offset voltage. However, it may be negative DC offset voltage.

In the case where the first DC offset voltage $V_{OS1}$ is positive DC offset voltage, the output CMP of the voltage comparator CMP0 becomes the high level H "1". In the case where the first DC offset voltage $V_{OS1}$ is negative DC offset voltage, the output CMP of the voltage comparator CMP0 becomes the low level L "0".

At the negative edge of the second clock signal CLK P2, the offset cancellation control circuit 100 stores a derived result of the DC offset voltage $V_{OS1}$ by the voltage comparator CMP0. Therefore, in the case of positive DC offset voltage, the offset cancellation control circuit 100 controls the terminal 3 and the terminal 1 of the polarity switch SWS to the on state and controls the terminal 3 and the terminal 2 to the off state. In the case of negative DC offset voltage, the offset cancellation control circuit 100 controls the terminal 3 and the terminal 1 of the polarity switch SWS to the off state and controls the terminal 3 and the terminal 2 to the on state.

Therefore, in the case where the DC offset voltage $V_{OS1}$ is positive DC offset voltage, the analog output current $I_{DACout}$ flows from the differential output terminal OUT to the digital-to-analog converter DAC0 of the active RC low-pass filter 300, and the DC offset voltage $V_{OS1}$ shifts to the negative side. In the case where the DC offset voltage $V_{OS1}$ is negative DC offset voltage, the analog output current $I_{DACout}$ flows from the differential output terminal OUTB of the active RC low-pass filter 300 to the digital-to-analog converter DAC0, and the DC offset voltage $V_{OS1}$ shifts relatively to the positive side. As described above, the offset cancellation control circuit 100 executes switching in the polarity switch SWS so that the analog output current $I_{DACout}$ of the digital-to-analog converter DAC0 flows from the output terminal having higher output terminal voltage between the differential output terminals OUTT and OUTB of the active RC low-pass filter 300. For the DAC code input signal DACS of the most significant bit (MSB) after that, the value DACS (P2) of the DAC code input signal DACS of the most significant bit (MSB) stored in the offset cancellation control circuit 100 at the timing of the negative edge of the second clock signal CLK P2 is used.

Next, at the positive edge of the third clock signal CLK P3, the offset cancellation control circuit 100 supplies the DAC code input signals DAC2, DAC1, and DAC0 having the relation shown below to the digital-to-analog converter DAC0.

DACS=DACS (P2)
DAC2=high level H "1"
DAC1=low level L "0"
DAC0=low level L "0"

In response to the DAC code input signals DAC2, DAC1, and DAC0 having the relation, the first analog output current $I_{DACout}$ depending on the DAC code shown in FIG. 3 flows from the output terminal having higher output terminal voltage out of the differential output terminals OUTT and OUTB of the active RC low-pass filter 300 to the output terminal of the digital-to-analog converter DAC0. As a result, in the resistor R22 coupled or connected to the output terminal having higher output terminal voltage, a voltage drop is caused by the first analog output current $I_{DACout}$. Therefore, a calibration DC offset voltage $V_{OS2}$ between the non-inversion input terminal and the inversion input terminal of the voltage comparator CMP0 changes from the value of the first calibration DC offset voltage which is almost equal to the DC offset voltage $V_{OS1}$ in the differential output terminals OUTT and OUTB of the active RC low-pass filter 300 to the second calibration DC offset voltage $V_{OS2}$ in response to the first analog output current $I_{DACout}$.

In the case where the second calibration DC offset voltage $V_{OS2}$ responding to the positive edge of the third clock signal CLK P3 is positive DC offset voltage, the output CMP of the voltage comparator CMP0 becomes the high level H "1". In the case where the second calibration DC offset voltage $V_{OS2}$ is negative DC offset voltage, the output CMP of the voltage comparator CMP0 becomes the low level L "0".

At the negative edge of the third clock signal CLK P3, the offset cancellation control circuit 100 stores a derived result of the DC offset voltage $V_{OS2}$ by the voltage comparator CMP0. Therefore, in the case where the second calibration DC offset voltage $V_{OS2}$ is positive DC offset voltage, the offset cancellation control circuit 100 controls the terminal 3 and the terminal 1 of the switch SW2 to the on state and controls the terminal 3 and the terminal 2 to the off state by the DAC code input signal DAC2 of the second highest bit of the high level H "1". On the other hand, in the case where the second calibration DC offset voltage $V_{OS2}$ is negative DC offset voltage, the offset cancellation control circuit 100 controls the terminal 3 and the terminal 1 of the switch SW2 to the off state and controls the terminal 3 and the terminal 2 to the on state by the DAC code input signal DAC2 of the second highest bit of the low level L "0". For the DAC code input signal DAC2 of the second highest bit after that, the value DAC2 (P3) of the DAC code input signal DAC2 of the second highest bit stored in the offset cancellation control circuit 100 at the timing of the negative edge of the third clock signal CLK P3 is used.

Next, at the positive edge of the fourth clock signal CLK P4, the offset cancellation control circuit 100 supplies the DAC code input signals DAC2, DAC1, and DAC0 having the relation shown below to the digital-to-analog converter DAC0.

DACS=DACS (P2)
DAC2=DAC2 (P3)
DAC1=high level H "1"
DAC0=low level L "0"

In response to the DAC code input signals DAC2, DAC1, and DAC0 having the relation, the second analog output current $I_{DACout}$ depending on the DAC code shown in FIG. 3 flows from the output terminal having higher output terminal voltage out of the differential output terminals OUTT and OUTB of the active RC low-pass filter 300 to the output terminal of the digital-to-analog converter DAC0. As a result, the calibration DC offset voltage $V_{OS2}$ between the non-inversion input terminal and the inversion input terminal of the voltage comparator CMP0 changes from the value of the second calibration DC offset voltage to the third calibration DC offset voltage $V_{OS2}$ in response to the second analog output current $I_{DACout}$.

In the case where the third calibration DC offset voltage $V_{OS2}$ responding to the positive edge of the fourth clock signal CLK P4 is positive DC offset voltage, the output CMP of the voltage comparator CMP0 becomes the high level H "1". In the case where the third calibration DC offset voltage $V_{OS2}$ is negative DC offset voltage, the output CMP of the voltage comparator CMP0 becomes the low level L "0".

At the negative edge of the fourth clock signal CLK P4, the offset cancellation control circuit 100 stores a derived result of the third calibration DC offset voltage $V_{OS2}$ by the voltage comparator CMP0. Therefore, in the case where the third calibration DC offset voltage $V_{OS2}$ is positive DC offset voltage, the offset cancellation control circuit 100 controls the terminal 3 and the terminal 1 of the switch SW1 to the on state and controls the terminal 3 and the terminal 2 to the off state by the DAC code input signal DAC1 of the third highest bit of the high level H "1". On the other hand, in the case where the third calibration DC offset voltage $V_{OS2}$ is negative DC offset voltage, the offset cancellation control circuit 100 controls the terminal 3 and the terminal 1 of the switch SW2 to the off state and controls the terminal 3 and the terminal 2 to the on state by the DAC code input signal DAC1 of the third highest bit of the low level L "0". For the DAC code input signal DAC1 of the third highest bit after that, the value DAC1 (P4) of the DAC code input signal DAC1 of the third highest bit stored in the offset cancellation control circuit 100 at the timing of the negative edge of the fourth clock signal CLK P4 is used.

Next, at the positive edge of the fifth clock signal CLK P5, the offset cancellation control circuit 100 supplies the DAC code input signals DAC2, DAC1, and DAC0 having the relation shown below to the digital-to-analog converter DAC0.

DACS=DACS (P2)
DAC2=DAC2 (P3)
DAC1=DAC1 (P4)
DAC0=high level H "1"

In response to the DAC code input signals DAC2, DAC1, and DAC0 having the relation, the third analog output current $I_{DACout}$ depending on the DAC code shown in FIG. 3 flows from the output terminal having higher output terminal voltage out of the differential output terminals OUTT and OUTB of the active RC low-pass filter 300 to the output terminal of the digital-to-analog converter DAC0. Therefore, the calibration DC offset voltage $V_{OS2}$ between the non-inversion input terminal and the inversion input terminal of the voltage comparator CMP0 changes from the value of the third calibration DC offset voltage to the fourth calibration DC offset voltage $V_{OS2}$ in response to the third analog output current $I_{DACout}$.

In the case where the fourth calibration DC offset voltage $V_{OS2}$ responding to the positive edge of the fifth clock signal CLK P5 is positive DC offset voltage, the output CMP of the voltage comparator CMP0 becomes the high level H "1". In the case where the fourth calibration DC offset voltage $V_{OS2}$ is negative DC offset voltage, the output CMP of the voltage comparator CMP0 becomes the low level L "0".

At the negative edge of the fifth clock signal CLK P5, the offset cancellation control circuit 100 stores a derived result of the fourth calibration DC offset voltage $V_{OS2}$ by the voltage comparator CMP0. Therefore, in the case where the fourth calibration DC offset voltage $V_{OS2}$ is positive DC offset voltage, the offset cancellation control circuit 100 controls the terminal 3 and the terminal 1 of the switch SW0 to the on state and controls the terminal 3 and the terminal 2 to the off state by the DAC code input signal DAC0 of the least significant bit of the high level H "1". On the other hand, in the case where the fourth calibration DC offset voltage $V_{OS2}$ is negative DC offset voltage, the offset cancellation control circuit 100 controls the terminal 3 and the terminal 1 of the switch SW2 to the off state and controls the terminal 3 and the terminal 2 to the on state by the DAC code input signal DAC0 of the least significant bit (LSB) of the low level L "0". For the DAC code input signal DAC0 of the least significant bit (LSB) after that, the value DAC0 (P5) of the DAC code input signal DAC0 of the least significant bit stored in the offset cancellation control circuit 100 at the timing of the negative edge of the fifth clock signal CLK P5 is used.

At this time point, the calibration DC offset voltage $V_{OS2}$ between the non-inversion input terminal and the inversion input terminal of the voltage comparator CMP0 is converged to a small voltage value of $\pm 0.5 \times I_{REF} \times RD$ by the DC offset cancelling operation of the DC offset cancellation circuit.

Finally, to finish the DC offset cancelling operation of the DC offset cancellation circuit, the offset compensation start signal CAL supplied to the offset cancellation control circuit 100 and the switch SWIO is changed from the high level H "1" to the low level L "0" at the negative edge timing of the sixth clock signal CLK P6.

Therefore, in the switch SWIO, one of the terminals 1 and the other terminal 1 are not coupled or connected to one of the terminals 3 and the other terminal 3, respectively, in the off state, one of the terminals 2 and the other terminal 2 are coupled or connected to one of the terminals 3 and the other terminal 3, respectively, in the on state, and the DC offset cancelling operation is finished. That is, in the direct conversion receiver provided in the semiconductor integrated circuit according to the first embodiment of the invention illustrated in FIG. 8, a voltage drop in one of the two feedback resistors R2 and R2 of the active RC low-pass filter 300 having the biquad configuration is increased by the final analog output current of the digital-to-analog converter DAC0, so that the voltage level of the DC offset voltage $V_{OS1}$ at the differential output terminals OUTT and OUTB of the active RC low-pass filter 300 is adjusted to almost zero.

Configuration of Reception Mixer of Receiver

FIG. 10 is a diagram showing a configuration of the reception mixer MIXER of the direct conversion receiver provided in the semiconductor integrated circuit according to the first embodiment of the invention illustrated in FIG. 7.

As illustrated in FIG. 10, the reception mixer MIXER of the direct conversion receiver is configured by a passive mixer PM and a current-to-voltage converter IVC.

To one end of one of capacitors C3 and one end of the other capacitor C3 in the passive mixer PM, the non-inverted RF reception amplification signal RF and the inverted RF reception amplification signal RFB generated from the differential output terminals of the low noise amplifier LNA shown in FIG. 7 are supplied, respectively. The other end of the one of the capacitors C3 in the passive mixer PM is coupled or connected to the inversion input terminal − of the operational amplifier OPA3 of the current-to-voltage converter IVC via a drain/source current path of the P-channel MOS transistor Mp1 as one of the P-channel MOS transistors. The other end of the other capacitor C3 in the passive mixer PM is coupled or connected to the inversion input terminal − of the operational amplifier OPA3 of the current-to-voltage converter IVC via a drain/source current path of the other P-channel MOS transistor Mpb. The other end of the one of the capacitors C1 in the passive mixer PM is coupled or connected to the non-inversion input terminal + of the operational amplifier OPA3 of the current-to-voltage converter IVC via a drain/source current path of the P-channel MOS transistor Mp as one of the P-channel MOS transistors. The other end of the other capacitor C3 in the passive mixer PM is coupled or connected to the non-inversion input terminal + of the operational amplifier OPA3 of the current-to-voltage converter IVC via a drain/source current path of the other P-channel MOS transistor Mp1b. A non-inverted RF reception local signal LO generated from the RF reception local oscillator RF_OSC shown in FIG. 7 is supplied to the gate terminal of the P-channel MOS transistor Mp1 and the gate terminal of the P-channel MOS transistor Mp1b, and an inverted RF reception local signal LOB generated from the RF reception local oscillator RF_OSC shown in FIG. 7 is supplied to the gate terminal of the P-channel MOS transistor Mp and the gate terminal of the P-channel MOS transistor Mpb.

The back gate of each of the P-channel MOS transistors used for the passive mixer PM is coupled or connected to the power supply voltage terminal of high voltage which is not illustrated in FIG. 10. With the configuration, even when a large signal is supplied from the low noise amplifier LNA, a PN junction diode between the drain or source and the back gate is not turned on and the operation of the passive mixer is not lost. As another configuration example, the passive mixer PM can be configured by N-channel MOS transistors. In this case, the back gate of each of the N-channel MOS transistors is grounded.

In the current-to-voltage converter IVC, the feedback capacitor C1 and the feedback resistor R3 are coupled or connected in parallel between the inversion input terminal − and the non-inversion output terminal + of the operational amplifier OPA3, and the feedback capacitor C1 and the feedback resistor R3 are coupled or connected in parallel between the non-inversion input terminal + and the inversion output terminal − of the operational amplifier OPA3. A differential reception baseband signal generated between the non-inversion output terminal + and the inversion output terminal − of the operational amplifier OPA3 is supplied as the input signal voltage $V_{IN}$ to the non-inversion input terminal INT and the inversion input terminal INB of the active RC low-pass filter 300 having the biquad configuration.

By supplying the common mode voltage $V_{CM}$ as the DC bias voltage level of the non-inversion input terminal + and the inversion input terminal − to the operational amplifier OPA3 of the current-to-voltage converter IVC, the common voltage of the inversion output terminal − and the non-inversion output terminal + of the operational amplifier OPA3 is detected, and the bias current in the operational amplifier OPA3 is adjusted so that the common voltage of the inversion output terminal − and the non-inversion output terminal + detected coincides with the common mode voltage $V_{CM}$. As a result, in the operational amplifier OPA3 in the current-to-voltage converter IVC, the input common voltage of the inversion input terminal − and the non-inversion input terminal + and the output common voltage of the non-inversion output terminal + and the inversion output terminal − become almost the same voltage level, and the direct current of the resistor R3 can be reduced to almost zero.

The passive mixer PM as the reception mixer MIXER of the direct conversion receiver provided in the semiconductor integrated circuit according to the first embodiment of the invention illustrated in FIG. 10 has an advantage that power from the power supply voltage $V_{DD}$ is unnecessary.

FIG. 11 is a diagram showing another configuration of the reception mixer MIXER of the direct conversion receiver provided in the semiconductor integrated circuit according to the first embodiment of the invention illustrated in FIG. 7.

As illustrated in FIG. 11, the reception mixer MIXER of the direct conversion receiver is configured by a Gilbert cell GC as an active mixer, a source follower SF, and a common voltage generator CVG.

As illustrated in FIG. 11, the Gilbert cell GC is configured as a double-balanced mixer by a first differential pair M1 and M2 driven by the RF reception amplification signal RF generated from an output of the low noise amplifier LNA shown in FIG. 7, and a second differential pair M3 and M4 and a third differential pair M5 and M6 driven by the RF reception local signal LO generated from an output of the RF reception local oscillator RF_OSC shown in FIG. 7. Three source resistors Rs1, Rs2, and Rs3 are coupled or connected in a π shape between the source terminals of the N-channel MOS transistors M1 and M2 of the first differential pair and the ground voltage GND.

The drain terminal of the N-channel MOS transistor M1 in the first differential pair is coupled or connected to the source terminals of the N-channel MOS transistors M3 and M4 in the second differential pair, and the drain terminal of the other N-channel MOS transistor M2 in the first differential pair is coupled or connected to the source terminals of the N-channel MOS transistors M5 and M6 of the third differential pair.

The drain terminal of the N-channel MOS transistor M3 in the second differential pair and the drain terminal of the N-channel MOS transistor M5 in the third differential pair are coupled or connected to the power supply voltage $V_{DD}$ via a drain load resistor Rd1, and the drain terminal of the other N-channel MOS transistor M4 in the second differential pair and the drain terminal of the other N-channel MOS transistor M6 in the third differential pair are coupled or connected to the power supply voltage $V_{DD}$ via the other drain load resistor Rd2.

The source follower SF includes an N-channel MOS transistor M7 whose gate terminal is driven by one of output voltages of the drain load resistor Rd1 in the Gilbert cell GC, and the other N-channel MOS transistor M8 whose gate terminal is driven by the other output voltage of the other drain load resistor Rd2 in the Gilbert cell GC. The drain terminals of the N-channel MOS transistors M7 and M8 are coupled or connected to the power supply voltage $V_{DD}$, the source terminal of the N-channel MOS transistor M7 is coupled or connected to the ground voltage GND via a resistor Rs7, and the source terminal of the other N-channel MOS transistor M8 is coupled or connected to the ground voltage GND via a resistor Rs8. A differential reception baseband signal generated between the source terminals of the N-channel MOS transistors M7 and M8 is supplied as the input signal voltage $V_{IN}$ to the non-inversion input terminal INT and the inversion input terminal INB of the active RC low-pass filter 300 having the biquad configuration.

Further, the differential reception baseband signal generated between the source terminals of the N-channel MOS transistors M7 and M8 is supplied to one end of the resistor Rc7 in the common voltage generator CVG and one end of the other resistor Rc8, and the common mode voltage $V_{CM}$ is generated from the common coupling node of the other end of the resistor Rc7 and the other end of the other resistor Rc8 in the common voltage generator CVG. The common mode voltage $V_{CM}$ generated from the common voltage generator CVG is supplied to the operational amplifier OPA1 in the first stage and the operational amplifier OPA2 in the second stage in the active RC low-pass filter 300 having the biquad configuration coupled or connected to the source follower SF. As a result, also in the direct conversion receiver provided in the semiconductor integrated circuit according to the first embodiment illustrated in FIG. 11, in the operational amplifier OPA1 in the first stage and the operational amplifier OPA2 in the second stage of the active RC low-pass filter 300 having the biquad configuration, the input common voltage of the inversion input terminal − and the non-inversion input terminal + and the output common voltage of the non-inversion output terminal + and the inversion output terminal − become almost the same voltage level, and the direct current in the resistors R2 and R3 of the active RC low-pass filter 300 having the biquad configuration can be reduced to almost zero.

The Gilbert cell GC as an active mixer serving as the reception mixer MIXER of the direct conversion receiver provided in the semiconductor integrated circuit according to the first embodiment of the invention illustrated in FIG. 11 has an advantage such that noise is lower because of amplification gain of the Gilbert cell GC as compared with the passive mixer PM illustrated in FIG. 11.

Operational Amplifier in Common Mode Feedback Circuit Format

FIG. 12 is a diagram showing a configuration of an operational amplifier in a common-mode feedback circuit format which can be used as each of the operational amplifier OPA1 in the first stage and the operational amplifier OPA2 in the second stage of the active RC low-pass filter 300 having the biquad configuration of the direct conversion receiver provided in the semiconductor integrated circuit according to the first embodiment of the invention illustrated in FIG. 7.

As illustrated in FIG. 12, the operational amplifier in the common mode feedback circuit form includes N-channel MOS transistors Mn and Mnb as a differential pair of transistors, P-channel MOS transistors Mp and Mpb as passive load transistors, an N-channel MOS transistor Mnc as a current source transistor passing bias current of the operational amplifier, an average voltage detection circuit AVC, and a common-mode feedback circuit CMFBC.

To the gate terminal of the N-channel MOS transistor Mn as one of the differential pair of transistors and the gate terminal of the other N-channel MOS transistor Mnb, a non-inversion input signal Vin+ of the non-inversion input terminal + and an inversion input signal Vin− of the inversion input terminal − in the operational amplifier are supplied. Therefore, from the drain terminal of the N-channel MOS transistor Mn as one of the differential pair of transistors and the drain terminal of the other N-channel MOS transistor Mnb, the inversion output signal Vout− of the inversion output terminal − and the non-inversion output signal Vout+ of the non-inversion output terminal + in the operational amplifier are generated.

The inversion output signal Vout− of the inversion output terminal − and the non-inversion output signal Vout+ of the non-inversion output terminal + in the operational amplifier are supplied to the two input terminals of the average voltage generation circuit AVC, so that a common voltage $V_{AV}$ as an average voltage of the inversion output signal Vout− and the non-inversion output signal Vout+ is detected from the output terminal of the average voltage detection circuit AVC. The common voltage $V_{AV}$ detected by the average voltage detection circuit AVC is supplied to the non-inversion input terminal + of the common-mode feedback circuit CMFBC, and the common mode voltage $V_{CM}$ is supplied to the inversion input terminal − of the common-mode feedback circuit CMFBC. Since the voltage level of the common mode voltage $V_{CM}$ is the DC bias voltage level of the non-inversion input signal Vin+ and the inversion input signal Vin− of the operational amplifier, the bias current of the N-channel MOS transistor Mnc of the current source transistor is adjusted by an output signal of the common-mode feedback circuit CMFBC so that the common voltage $V_{AV}$ and the common mode voltage $V_{CM}$ coincide with each other.

FIG. 13 is a diagram showing a configuration of an operational amplifier in a common-mode feedback circuit format which can be used more preferably as each of the operational amplifier OPA1 in the first stage and the operational amplifier OPA2 in the second stage of the active RC low-pass filter 300 having the biquad configuration of the direct conversion receiver provided in the semiconductor integrated circuit according to the first embodiment of the invention illustrated in FIG. 7.

The operational amplifier in the common-mode feedback circuit format illustrated in FIG. 13 is different from that in the common-mode feedback circuit format illustrated in FIG. 12 with respect to the following point.

Specifically, the average voltage detection circuit AVC of the operational amplifier in the common-mode feedback circuit format illustrated in FIG. 13 includes two N-channel MOS transistors Mns and Mnsb operating as a source follower and two resistors R4 and R4b. To the gate terminal of the N-channel MOS transistor Mns and the gate terminal of the other N-channel MOS transistor Mnsb in the source follower, the non-inversion output signal Vout+ of the drain terminal of the other N-channel MOS transistor Mnb in the operational amplifier and the inversion output signal Vout− of the drain terminal of the N-channel MOS transistor Mn are supplied, respectively. The drain terminals of the N-channel MOS transistors Mns and Mnsb in the source follower are commonly coupled or connected to the power supply voltage $V_{DD}$, the source terminal of the N-channel MOS transistor Mns in the source follower and the source terminal of the other N-channel MOS transistor Mnsb are coupled or connected to one end of the resistor R4 and one end of the resistor R4b, respectively, and the common voltage $V_{AV}$ detected by the average voltage detection circuit AVC is generated from the common coupling point of the other end of the resistor R4 and the other end of the resistor R4b. To the inversion input terminal − of the common-mode feedback circuit CMFBC, the common mode voltage $V_{CM}$ is supplied via the gate/source of the N-channel MOS transistor Mnsc as the other source follower.

In the operational amplifier of the common-mode feedback circuit format illustrated in FIG. 13, without making the resistance of the two resistors R4 and R4b high, decrease in the open loop gain of the operational amplifier can be avoided by the operation of the two N-channel MOS transistors Mns and Mnsb operating as the source follower. The level shift voltage between the gate and the source of the two N-channel MOS transistors Mns and Mnsb operating as the source follower can be compensated by the level shift voltage between the gate and the source of the N-channel MOS transistor Mnsc of another source follower.

Second Embodiment

Quadrature Down-Conversion Receiver

Figure 14:
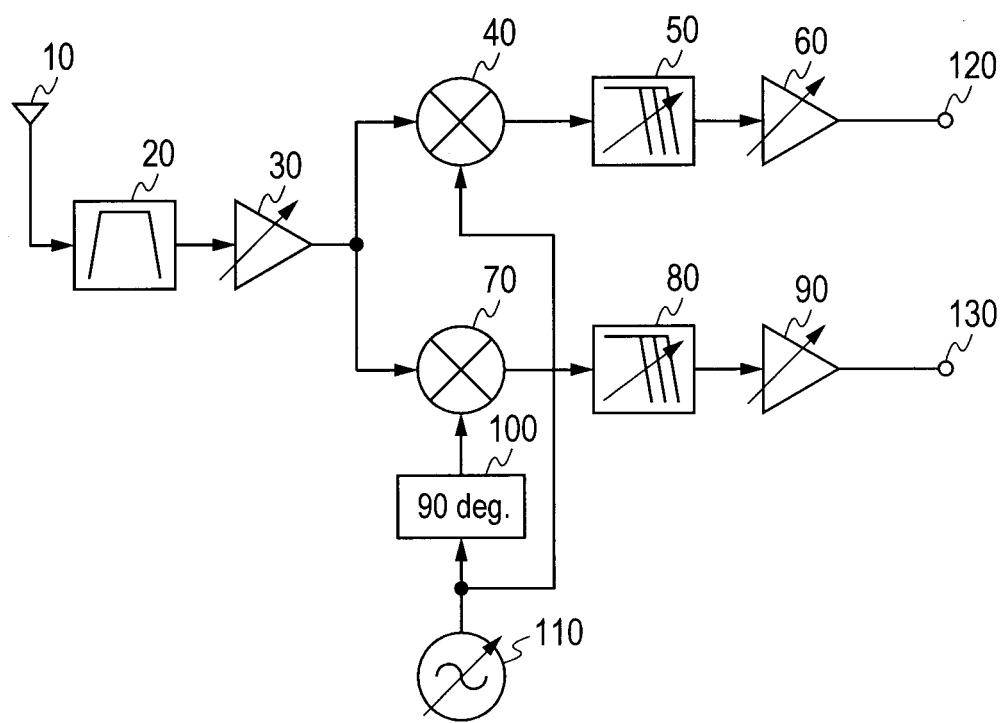
FIG. 14 is a diagram showing a configuration of a receiver according to a second embodiment of the present invention when the direct conversion receiver provided in the semiconductor integrated circuit according to the first embodiment of the invention described with reference to FIGS. 7 to 13 is applied to a quadrature down-conversion system having a two-channel analog baseband unit of an I channel of an in-phase component and a Q channel of a quadrature component.

FIG. 14 is a diagram showing a configuration of a receiver according to a second embodiment of the present invention when the direct conversion receiver provided in the semiconductor integrated circuit according to the first embodiment of the invention described with reference to FIGS. 7 to 13 is applied to a quadrature down-conversion system having a two-channel analog baseband unit of an I channel of an in-phase component and a Q channel of a quadrature component.

A quadrature direct down-conversion system according to the second embodiment of the invention illustrated in FIG. 14 has an antenna 10, a bandpass filter 20, a low noise amplifier 30, an I-signal mixer 40, a first channel selection filter 50, a first amplifier 60, a Q-signal mixer 70, a second channel selection filter 80, a second amplifier 90, a 90-degree phase shifter 100, and an RF voltage-controlled oscillator 110.

In the quadrature direct down-conversion receiver of FIG. 14, the low noise amplifier 30, the I-signal mixer 40, the first channel selection filter 50, the first amplifier 60, the Q-signal mixer 70, the second channel selection filter 80, the second amplifier 90, the 90-degree phase shifter 100, and the RF voltage-controlled oscillator 110 are integrated in a semiconductor chip of a semiconductor integrated circuit mounted on a cellular cell terminal.

By the RF voltage-controlled oscillator (VCO) 110 and the 90-degree phase shifter 100, an I local signal and a Q local signal having a phase difference of 90 degrees are supplied to the I-signal mixer 40 and the Q-signal mixer 70, respectively. An RF reception signal received by the antenna 10 is supplied to the input terminal of the low noise amplifier 30 via the bandpass filter 20, and an RF reception amplified signal of the low noise amplifier 30 is supplied to each of the I-signal mixer and the Q-signal mixer 70 constructing a quadrature down-conversion mixer. An I baseband signal generated from the I signal mixer 40 is supplied to the first channel selection filter 50 and the first amplifier 60. On the other hand, a Q baseband signal generated from the Q-signal mixer 70 is supplied to the second channel selection filter 80 and the second amplifier 90.

In the quadrature direct down-conversion receiver illustrated in FIG. 14, in practice, the first channel selection filter 50 and the first amplifier 60 for the I channel of the in-phase component are realized by the two functions of the filter process and the amplification function (voltage gain) of the active RC low-pass filter 300 having the biquad configuration provided in the semiconductor integrated circuit according to the first embodiment of the invention described with reference to FIGS. 7 to 13.

Further, in the quadrature direct down-conversion receiver illustrated in FIG. 14, in practice, the second channel selection filter 80 and the second amplifier 90 for the Q channel of the quadrature component are realized by the two functions of the filter process and the amplification function (voltage gain) of the active RC low-pass filter 300 having the biquad configuration provided in the semiconductor integrated circuit according to the first embodiment of the invention described with reference to FIGS. 7 to 13.

Although the present invention achieved by the inventors herein has been concretely described above on the basis of the various embodiments, obviously, the present invention is not limited to the embodiments but can be variously changed without departing from the gist.

For example, the N-channel MOS transistor used in the semiconductor integrated circuit in the embodiments of the invention can be replaced with an NPN bipolar transistor. Further, the P-channel MOS transistor used in the semiconductor integrated circuit in the embodiments of the invention can be replaced with a PNP bipolar transistor.

Further, the direct conversion receiver provided in the semiconductor integrated circuit of the embodiments of the invention can be also applied to a wireless communication terminal other than a cellular phone.

What is claimed is:

1. A semiconductor integrated circuit comprising:
an active low-pass filter having a filter processing function and an amplifying function;
two calibration resistors coupled to differential output terminals of the active low-pass filter;
a voltage comparator coupled to the differential output terminals of the active low-pass filter via the two calibration resistors;
a control circuit that generates a digital control signal on the basis of an output signal of the voltage comparator and outputs the signal;
a digital-to-analog converter that converts the digital control signal output from the control circuit into a calibration analog current and outputs the current; and
a switch that switches coupling of an output terminal of the digital-to-analog converter between the two calibration resistors and differential input terminals of an operational amplifier in a first stage in the active low-pass filter,
wherein in a calculation period of calculating the digital control signal for reducing the DC offset voltage between the differential output terminals of the active low-pass filter, the control circuit calculates the digital control signal by detecting calibration voltage between the two input terminals depending on voltage drop in at least one of the two calibration resistors caused by the calibration analog current flowing in an analog current output terminal of the digital-to-analog converter by the voltage comparator, and
wherein in a calibration period of reducing the DC offset voltage after the calculation period, the calibration analog current as an output signal of the digital-to-analog converter responding to the digital control signal calculated by the control circuit flows in at least one of the differential input terminals of the operational amplifier in the first stage via the switch.

2. The semiconductor integrated circuit according to claim 1,
wherein one of terminals of the two calibration resistors is coupled to the differential output terminals of the active low-pass filter, and two input terminals of the voltage comparator and two first terminals of the switch are coupled to the other terminal of the two calibration resistors,
wherein two second terminals of the switch are coupled to differential input terminals of the operational amplifier in the first stage, and the output terminals of the digital-to-analog converter include a first analog current output terminal and a second analog current output terminal,
wherein one of two third terminals of the switch is coupled to the first analog current output terminal, and the other of the two third terminals of the switch is coupled to the second analog current output terminal, wherein the control circuit supplies the digital control signal for reducing the DC offset voltage between the differential output terminals of the active low-pass filter to a digital input terminal of the digital-to-analog converter in response to a voltage comparison result of the voltage comparator, wherein in the calculation period, the control circuit controls the two first terminals and the two third terminals of the switch to be in a conductive state, and controls the two second terminals and the two third terminals of the switch to be in a non-conductive state, and wherein in the calibration period, the control circuit controls the two first terminals and the two third terminals of the switch to be in a non-conductive state, and controls the two second terminals and the two third terminals of the switch to be in a conductive state.

3. The semiconductor integrated circuit according to claim 2, wherein the active low-pass filter includes two first resistors, an operational amplifier in a first stage, two first capacitors, two second resistors, an operational amplifier in a second stage, two second capacitors, two third resistors, and two feedback resistors, wherein a differential input signal can be supplied to an inversion input terminal and a non-inversion input terminal of the operational amplifier in the first stage via the two first resistors, and the two first capacitors are coupled between the inversion input terminal and the non-inversion input terminal and a non-inversion output terminal and an inversion output terminal of the operational amplifier in the first stage, wherein the non-inversion output terminal and the inversion output terminal of the operational amplifier in the first stage are coupled to an inversion input terminal and a non-inversion input terminal of the operational amplifier in the second stage via the two second resistors, the two second capacitors are coupled between the inversion input terminal and the non-inversion input terminal and a non-inversion output terminal and an inversion output terminal of the operational amplifier in the second stage, and the two third resistors are coupled between the inversion input terminal and the non-inversion input terminal and the non-inversion output terminal and the inversion output terminal of the operational amplifier in the second stage, and wherein the two feedback resistors are coupled between the non-inversion output terminal and the inversion output terminal of the operational amplifier in the second stage and the inversion input terminal and the non-inversion input terminal of the operational amplifier in the first stage.

4. The semiconductor integrated circuit according to claim 3, wherein a resistance value of the two calibration resistors is set to be substantially equal to that of the two feedback resistors.

5. The semiconductor integrated circuit according to claim 4, wherein in the calculation period, the control circuit determines to which one of the first and second analog current output terminals of the digital-to-analog converter the calibration analog current as the output signal of the digital-to-analog converter is passed in response to a first voltage comparison result generated from the voltage comparator, on the basis of a signal of a most significant bit of the digital control signal generated from the control circuit.

6. The semiconductor integrated circuit according to claim 5, wherein an absolute value of the calibration current is determined by a plurality of signals of lower bits other than the most significant bit of the digital control signal generated from the control circuit.

7. The semiconductor integrated circuit according to claim 5, further comprising:

a low noise amplifier as a component of a direct conversion receiver;

an RF reception local oscillator; and a reception mixer, wherein an RF reception input signal received by an antenna of the receiver can be supplied to an input terminal of the low noise amplifier, and an RF reception amplification signal of an output terminal of the low noise amplifier can be supplied to one of input terminals of the reception mixer, and wherein an RF reception local signal generated from the RF reception local oscillator can be supplied to the other input terminal of the reception mixer, and a differential reception baseband signal generated from a differential output terminal of the reception mixer can be supplied as the differential input signal town inversion input terminal and a non-inversion input terminal of the operational amplifier in the first stage via the two first resistors.

8. The semiconductor integrated circuit according to claim 7, wherein the reception mixer includes a passive mixer and a current-to-voltage converter for converting a current signal output from the passive mixer to a voltage signal.

9. The semiconductor integrated circuit according to claim 7, wherein the reception mixer includes a Gilbert cell as an active mixer.

10. The semiconductor integrated circuit according to claim 7, wherein each of the operational amplifier in the first stage and the operational amplifier in the second stage in the active low-pass filter is an operation amplifier of a common mode feedback circuit format.

11. An operation method of a semiconductor integrated circuit comprising:

an active low-pass filter having a filter processing function and an amplifying function;

two calibration resistors coupled to differential output terminals of the active low-pass filter;

a voltage comparator coupled to the differential output terminals of the active low-pass filter via the two calibration resistors;

a control circuit that generates a digital control signal on the basis of an output signal of the voltage comparator and outputs the signal;

a digital-to-analog converter that converts the digital control signal output from the control circuit into a calibration analog current and outputs the current; and a switch that switches coupling of an output terminal of the digital-to-analog converter between the two calibration resistors and between differential input terminals of an operational amplifier in a first stage in the active low-pass filter, the method comprising the steps of:

in a calculation period of calculating the digital control signal for reducing the DC offset voltage between the differential output terminals of the active low-pass filter, calculating the digital control signal by the control circuit by detecting calibration voltage between the two input terminals depending on voltage drop in at least one of the two calibration resistors caused by the calibration analog current flowing in an analog current output terminal of the digital-to-analog converter by the voltage comparator; and in a calibration period of reducing the DC offset voltage after the calculation period, passing the calibration analog current as the output signal of the digital-to-analog converter responding to the digital control signal calculated by the control circuit into the differential input terminals of the operational amplifier in the first stage via the switch.

12. The operation method of the semiconductor integrated circuit according to claim 11, wherein one of terminals of the two calibration resistors is coupled to the differential output terminals of the active low pass filter, and two input terminals of the voltage comparator and two first terminals of the switch are coupled to the other terminal of the two calibration resistors, wherein two second terminals of the switch are coupled to differential input terminals of the operational amplifier in the first stage, and the output terminals of the digital-to-analog converter include a first analog current output terminal and a second analog current output terminal, wherein one of two third terminals of the switch is coupled to the first analog current output terminal, and the other of the two third terminals of the switch is coupled to the second analog current output terminal, wherein the control circuit supplies the digital control signal for reducing the DC offset voltage between the differential output terminals of the active low-pass filter to a digital input terminal of the digital-to-analog converter in response to a voltage comparison result of the voltage comparator, wherein in the calculation period, the control circuit controls the two first terminals and the two third terminals of the switch to be in a conductive state, and controls the two second terminals and the two third terminals of the switch to be in a non-conductive state, and wherein in the calibration period, the control circuit controls the two first terminals and the two third terminals of the switch to be in a non-conductive state, and controls the two second terminals and the two third terminals of the switch to be in a conductive state.

13. The operation method of the semiconductor integrated circuit according to claim 12, wherein the active low-pass filter includes two first resistors, an operational amplifier in a first stage, two first capacitors, two second resistors, an operational amplifier in a second stage, two second capacitors, two third resistors, and two feedback resistors, wherein a differential input signal can be supplied to an inversion input terminal and a non-inversion input terminal of the operational amplifier in the first stage via the two first resistors, and the two first capacitors are coupled between the inversion input terminal and the non-inversion input terminal and a non-inversion output terminal and an inversion output terminal of the operational amplifier in the first stage, and wherein the non-inversion output terminal and the inversion output terminal of the operational amplifier in the first stage are coupled to an inversion input terminal and a non-inversion input terminal of the operational amplifier in the second stage via the two second resistors, the two second capacitors are coupled between the inversion input terminal and the non-inversion input terminal and a non-inversion output terminal and an inversion output terminal of the operational amplifier in the second stage, the two third resistors are coupled between the inversion input terminal and the non-inversion input terminal and the non-inversion output terminal and the inversion output terminal of the operational amplifier in the second stage, and the two feedback resistors are coupled between the non-inversion output terminal and the inversion output terminal of the operational amplifier in the second stage and the inversion input terminal and the non-inversion input terminal of the operational amplifier in the first stage.

14. The operation method of the semiconductor integrated circuit according to claim 13, wherein a resistance value of the two calibration resistors is set to be substantially equal to that of the two feedback resistors.

15. The operation method of the semiconductor integrated circuit according to claim 14, further comprising the step of:

in the calculation period, determining to which one of the first and second analog current output terminals of the digital-to-analog converter the calibration analog current as the output signal of the digital-to-analog converter is passed in response to a first voltage comparison result generated from the voltage comparator, by the control circuit, wherein to which one of the first and second analog current output terminals of the digital-to-analog converter the calibration analog current is passed is determined by a signal of a most significant bit of the digital control signal generated from the control circuit.

16. The operation method of the semiconductor integrated circuit according to claim 15, wherein an absolute value of the calibration current is determined by a plurality of signals of lower bits other than the most significant bit of the digital control signal generated from the control circuit.

17. The operation method of the semiconductor integrated circuit according to claim 15, wherein the semiconductor integrated circuit further comprises a low noise amplifier as a component of a direct conversion receiver, an RF reception local oscillator, and a reception mixer, wherein an RF reception input signal received by an antenna of the receiver can be supplied to an input terminal of the low noise amplifier, and an RF reception amplification signal of an output terminal of the low noise amplifier can be supplied to one of input terminals of the reception mixer, and wherein an RF reception local signal generated from the RF reception local oscillator can be supplied to the other input terminal of the reception mixer, and a differential reception baseband signal generated from a differential output terminal of the reception mixer can be supplied as the differential input signal to an inversion input terminal and a non-inversion input terminal of the operational amplifier in the first stage via the two first resistors.

18. The operation method of the semiconductor integrated circuit according to claim 17, wherein the reception mixer includes a passive mixer and a current-to-voltage converter for converting a current signal output from the passive mixer to a voltage signal.

19. The operation method of the semiconductor integrated circuit according to claim 17, wherein the reception mixer includes a Gilbert cell as an active mixer.

20. The operation method of the semiconductor integrated circuit according to claim 17,
wherein each of the operational amplifier in the first stage and the operational amplifier in the second stage in the active low-pass filter is an operation amplifier of a common mode feedback circuit format.

\* \* \* \* \*